(12) United States Patent
Hasegawa et al.

(10) Patent No.: US 11,950,364 B2
(45) Date of Patent: Apr. 2, 2024

(54) MODULE AND EQUIPMENT

(71) Applicant: CANON KABUSHIKI KAISHA, Tokyo (JP)

(72) Inventors: Mitsutoshi Hasegawa, Kanagawa (JP); Satoru Higuchi, Tokyo (JP); Noritake Tsuboi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 126 days.

(21) Appl. No.: 17/528,816

(22) Filed: Nov. 17, 2021

(65) Prior Publication Data

US 2022/0167504 A1 May 26, 2022

(30) Foreign Application Priority Data

Nov. 20, 2020 (JP) .................................. 2020-193346
Sep. 9, 2021 (JP) .................................. 2021-146900

(51) Int. Cl.
*H05K 1/18* (2006.01)
*H05K 1/14* (2006.01)

(52) U.S. Cl.
CPC ..... *H05K 1/14* (2013.01); *H05K 2201/10037* (2013.01); *H05K 2201/10098* (2013.01)

(58) Field of Classification Search
CPC ........... H05K 1/14; H05K 2201/10037; H05K 2201/10098
USPC ........................................................ 361/737
See application file for complete search history.

(56) References Cited

U.S. PATENT DOCUMENTS

| | | | |
|---|---|---|---|
| 2011/0286194 A1* | 11/2011 | Kawabata | H05K 1/141 |
| | | | 361/803 |
| 2016/0307954 A1 | 10/2016 | Arima et al. | |
| 2020/0120251 A1 | 4/2020 | Toda | |
| 2020/0344869 A1* | 10/2020 | So | H01L 23/5383 |
| 2022/0369460 A1* | 11/2022 | Chuah | H05K 1/147 |

FOREIGN PATENT DOCUMENTS

| | | |
|---|---|---|
| JP | H0723267 A | 1/1995 |
| JP | H11177278 A | 7/1999 |
| JP | 2002368348 A | 12/2002 |
| JP | 2007295105 A | 11/2007 |
| JP | 2010245269 A | 10/2010 |
| JP | 2013130797 A | 7/2013 |
| JP | 2018067969 A | 4/2018 |
| JP | 2019021846 A | 2/2019 |

* cited by examiner

*Primary Examiner* — Binh B Tran
(74) *Attorney, Agent, or Firm* — Canon U.S.A., Inc. I.P. Division

(57) ABSTRACT

A module includes a first wiring board, a first integrated circuit component mounted on the first wiring board, a second wiring board overlapping with the first wiring board, a second integrated circuit component mounted on the second wiring board, and a connection member disposed between the first wiring board and the second wiring board and configured to electrically connect the first wiring board and the second wiring board, wherein the second integrated circuit component overlaps with the first wiring board and supplies power to the first integrated circuit component via the connection member.

30 Claims, 10 Drawing Sheets

MODULE AND EQUIPMENT

BACKGROUND

Field of the Disclosure

The present disclosure relates to a module including integrated circuit components and wiring boards.

Description of the Related Art

A module including a wiring board on which integrated circuit components are mounted is required to achieve both higher-density packaging and noise reduction.

Japanese Patent Application Laid-Open No. 2007-295105 discusses an image capturing apparatus including an image sensor mounted on one surface of a printed wiring board and an image sensor driving circuit mounted on the other surface of the printed wiring board.

The technique discussed in Japanese Patent Application Laid-Open No. 2007-295105 may not be sufficient for reducing or preventing effects of heat on the image sensor.

SUMMARY

Aspects of the present disclosure provide a technique that is advantageous in reducing or preventing generation of noise in a module including a wiring board on which integrated circuit components are mounted. According to an aspect of the present disclosure, a module includes a first wiring board, a first integrated circuit component mounted on the first wiring board, a second wiring board overlapping with the first wiring board, a second integrated circuit component mounted on the second wiring board, and a connection member disposed between the first wiring board and the second wiring board and configured to electrically connect the first wiring board and the second wiring board, wherein the second integrated circuit component overlaps with the first wiring board and supplies power to the first integrated circuit component via the connection member.

Further features of the present disclosure will become apparent from the following description of exemplary embodiments with reference to the attached drawings.

DESCRIPTION OF THE EMBODIMENTS

Figure 1A:
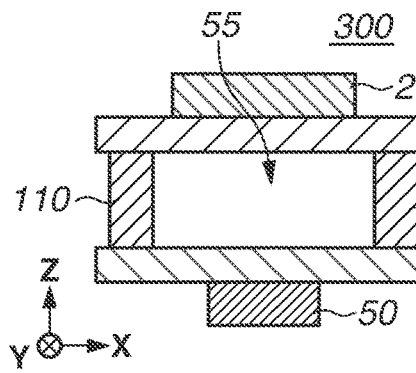
FIGS. 1A to 1F are diagrams illustrating sectional views of modules according to present exemplary embodiments.
Figure 1B:
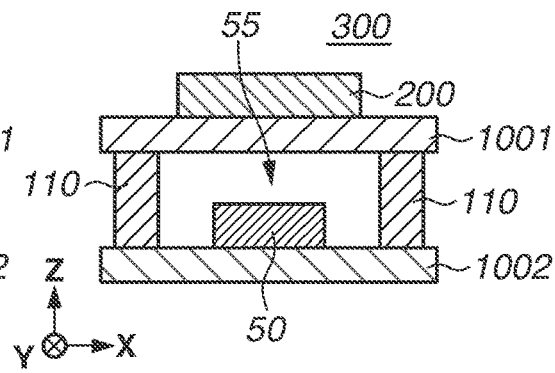

Modes for carrying out the present disclosure will be described below with reference to the drawings. In the following description and the accompanying drawings, a configuration common to a plurality of figures is denoted by a common reference numeral.

Accordingly, the common configuration will be described with reference to the plurality of figures, and descriptions of the configuration denoted by the common reference numeral is omitted as appropriate.

FIGS. 1A to 1F are diagrams each illustrating a Y-Z sectional view of a module 300 according to some exemplary embodiments for carrying out the disclosure. FIGS. 1G and 1H are diagrams each illustrating an X-Y perspective plan views of the module 300 according to some exemplary embodiments for carrying out the disclosure.

As illustrated in FIGS. 1A to 1D, the module 300 may include a wiring board 1001, an integrated circuit component 200, a wiring board 1002, an integrated circuit component 50, and a connection member 110.

The integrated circuit component 200 is mounted on the wiring board 1001. The wiring board 1002 overlaps with the wiring board 1001. The integrated circuit component 50 is mounted on the wiring board 1002. The connection member 110 is disposed between the wiring board 1001 and the wiring board 1002. The connection member 110 electrically connects the wiring board 1001 and the wiring board 1002. The integrated circuit component 50 overlaps with the wiring board 1001. A direction in which the wiring board 1001 and the wiring board 1002 overlap with each other is referred to as a Z-direction. A direction perpendicular to the Z-direction is referred to as an X-direction. A direction perpendicular to each of the X-direction and the Z-direction is referred to as a Y-direction. The integrated circuit component 50 supplies power to the integrated circuit component 200 via the connection member 110. The integrated circuit component 50 overlaps with the wiring board 1001, whereby the module 300 can be downsized.

The integrated circuit component 200 and the integrated circuit component 50 are mounted on the wiring board 1001 and the wiring board 1002, respectively, whereby effects of heat generated in the integrated circuit component 200 on the integrated circuit component 50 can be reduced. Consequently, noise that can be generated in the integrated circuit component 50 in accordance with a temperature of the integrated circuit component 50 can be reduced. Thus, when power is supplied from the integrated circuit component 50 to the integrated circuit component 200, noise that can be superimposed on a power line can be reduced. Consequently, operation of the integrated circuit component 200 can be stabilized. This effect is suitable for the module 300 in which a temperature of the integrated circuit component 200 becomes higher than a temperature of the integrated circuit component 50 when power is supplied. The temperature of the integrated circuit component 200 may be, for example, 60° C. or higher. Since effects of heat generated in the integrated circuit component 50 on the integrated circuit component 200 can be reduced, noise that can be generated in the integrated circuit component 200 in accordance with a temperature of the integrated circuit component 200 can be reduced. Accordingly, operation of the integrated circuit component 200 can be stabilized. Each integrated circuit component is a semiconductor component that includes at least one semiconductor substrate and a plurality of semiconductor elements disposed on the one semiconductor substrate. Examples of the semiconductor elements disposed on the semiconductor substrate may be transistors and diodes.

As illustrated in FIGS. 1A to 1D, it is desirable that the integrated circuit component 200 and the integrated circuit component 50 are disposed with a gap 55 therebetween. The gap 55 can reduce or prevent heat conduction between the integrated circuit component 200 and the integrated circuit component 50.

The wiring board 1001 and the wiring board 1002 are typically printed wiring boards. Each of the wiring board 1001 and the wiring board 1002 may be, for example, an interposer board, in which a wiring pattern is formed by a print method, such as a photolithography method not using a printing method. The wiring board 1001 and the wiring board 1002 are typically rigid wiring boards. The wiring board 1001 and the wiring board 1002 may be flexible wiring boards.

An exemplary embodiment of the present disclosure is suitable for a case where the integrated circuit component 200 includes an analog circuit. Although an analog circuit is more susceptible to noise than a digital circuit, noise can be reduced according to the present exemplary embodiment. The integrated circuit component 200 may be an image capturing device (image sensor) or a display device (display). While the image quality (image capturing quality or display quality) of the image capturing device or the display device can be affected by noise, according to the present exemplary embodiment, noise can be reduced. The image capturing device may be a charge-coupled device (CCD) image sensor, a complementary metal-oxide semiconductor (CMOS) image sensor, a Time-of-Flight (TOF) sensor, a single photon avalanche diode (SPAD) sensor, or the like. The display device may be an electroluminescence (EL) display, a liquid crystal display, or a digital mirror display.

The integrated circuit component 50 is a power supply device that supplies power as described above. For example, the integrated circuit component 50 is a device including a linear regulator or a direct current (DC)-to-DC converter. The integrated circuit component 50 may be a power supply integrated circuit (IC) having a single function, a power supply IC having a plurality of functions, or a power management IC (PMIC).

Figure 1C:
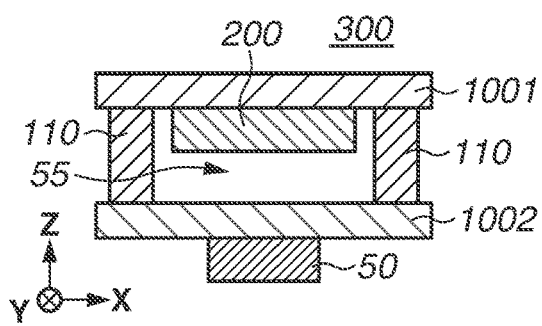
Figure 1D:
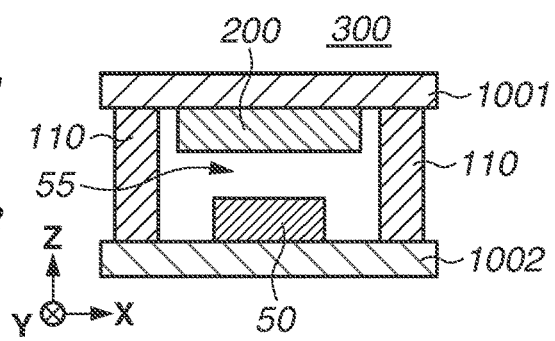

In examples illustrated in FIGS. 1A and 1C, the wiring board 1002 is disposed at a position between the integrated circuit component 50 and the wiring board 1001. In the examples illustrated in FIGS. 1A and 1C, the disposed position of the wiring board 1002 is also between the integrated circuit component 50 and the integrated circuit component 200. In examples illustrated in FIGS. 1B and 1D, the integrated circuit component 50 is disposed at a position between the wiring board 1001 and the wiring board 1002. In the examples illustrated in FIGS. 1A and 1B, the wiring board 1001 is disposed at a position between the integrated circuit component 200 and the wiring board 1002. In the examples illustrated in FIGS. 1A and 1B, the disposed position of the wiring board 1001 is also between the integrated circuit component 200 and the integrated circuit component 50. In the examples illustrated in FIGS. 1C and 1D, the integrated circuit component 200 is disposed at a position between the wiring board 1001 and the wiring board 1002. In the examples illustrated in FIGS. 1C and 1D, the disposed position of the integrated circuit component 200 is also between the wiring board 1001 and the integrated circuit component 50.

Figure 1E:
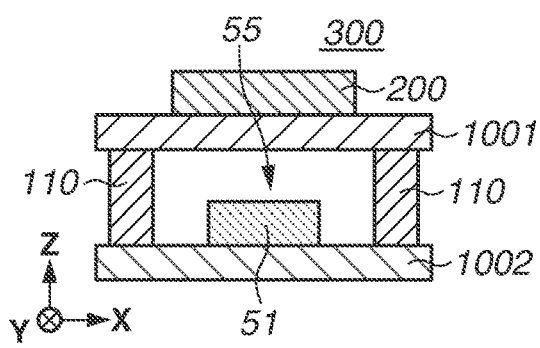
Figure 1F:
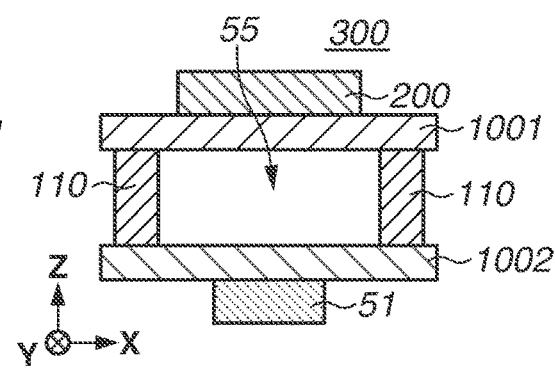
Figure 1G:
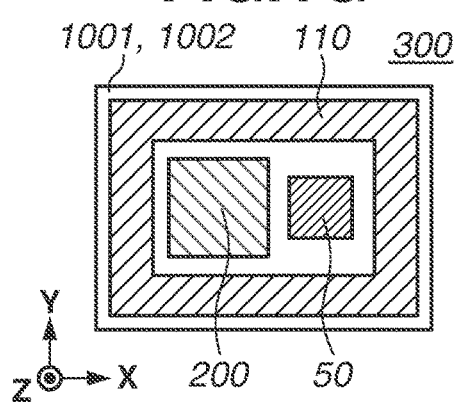
FIGS. 1G and 1H are diagrams illustrating perspective plane views of the modules according to the present exemplary embodiments
Figure 1H:
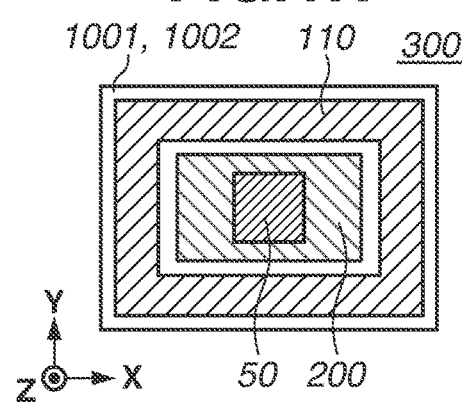

As illustrated in FIGS. 1E and 1F, the module 300 may include an integrated circuit component 51 that is mounted on the wiring board 1002. In an example illustrated in FIG. 1E, the integrated circuit component 51 is disposed between the wiring board 1001 and the wiring board 1002. In an example illustrated in FIG. 1F, the wiring board 1002 is disposed between the integrated circuit component 51 and the wiring board 1001. The integrated circuit component 50 may be configured to supply power to the integrated circuit component 51. Any one of the examples illustrated in FIGS. 1A to 1D and one of the examples illustrated in FIGS. 1E and 1F can be combined.

The integrated circuit component 51 may be a storage device (memory). The storage device may be a nonvolatile memory, such as a flash memory, or may be a volatile memory, such as a dynamic random access memory (DRAM) or a static RAM (SRAM). The integrated circuit component 51 may be a processing device (processor). The integrated circuit component 51 serving as a processing device may be a device that processes a signal to be input to the integrated circuit component 200, or a device that processes a signal output from the integrated circuit component 200. The integrated circuit component 51 may be a control device (controller). The integrated circuit component 51 serving as a control device may be a device that controls the integrated circuit component 200 or other components. The integrated circuit component 51 may be a communication device. The communication device performs wired communication or wireless communication. The communication device may perform communication with a frequency band of 3.5 to 5.0 GHz, or may perform communication with a frequency band of 24 to 53 GHz. The communication device may perform not only communication using microwaves or millimeter waves, but also communication using terahertz waves. The integrated circuit component 51 may include a semiconductor device manufactured using a 65 to 5 nm process, or may include a semiconductor device manufactured using a 1 to 4 nm process. To manufacture these semiconductor devices, an extreme ultraviolet (EUV) exposure apparatus, an electron beam exposure apparatus, a nanoimprint lithography apparatus, or the like can be used. A plurality of integrated circuit components 51 can be mounted on the wiring board 1002, and the plurality of integrated circuit components 51 may have different functions from each other. At least two devices selected from among the storage device, the processing device, and the control device can also be mounted on the wiring board 1002. The integrated circuit component 50 can also supply power to the plurality of integrated circuit components 51 mounted on the wiring board 1002.

In an example illustrated in FIG. 1H, the integrated circuit component 50 overlaps with the integrated circuit component 200. Since the integrated circuit component 50 overlaps with the integrated circuit component 200, the module 300 can be downsized. In an example illustrated in FIG. 1G, the integrated circuit component 50 does not overlap with the integrated circuit component 200. Since the integrated circuit component 50 does not overlap with the integrated circuit component 200, effects of heat generated in the integrated circuit component 200 on the integrated circuit component 50 can be reduced. Any one of the examples illustrated in FIGS. 1A to 1D and one of the examples illustrated in FIGS. 1G and 1H can be combined.

Figure 2A:
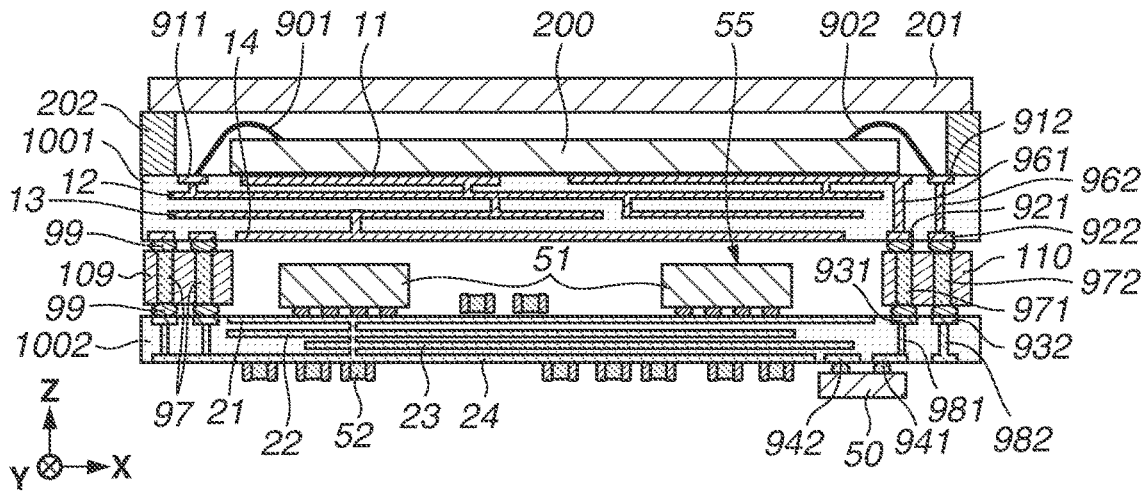
FIGS. 2A to 2C are schematic diagrams illustrating the modules according to the present exemplary embodiments.
Figure 2B:
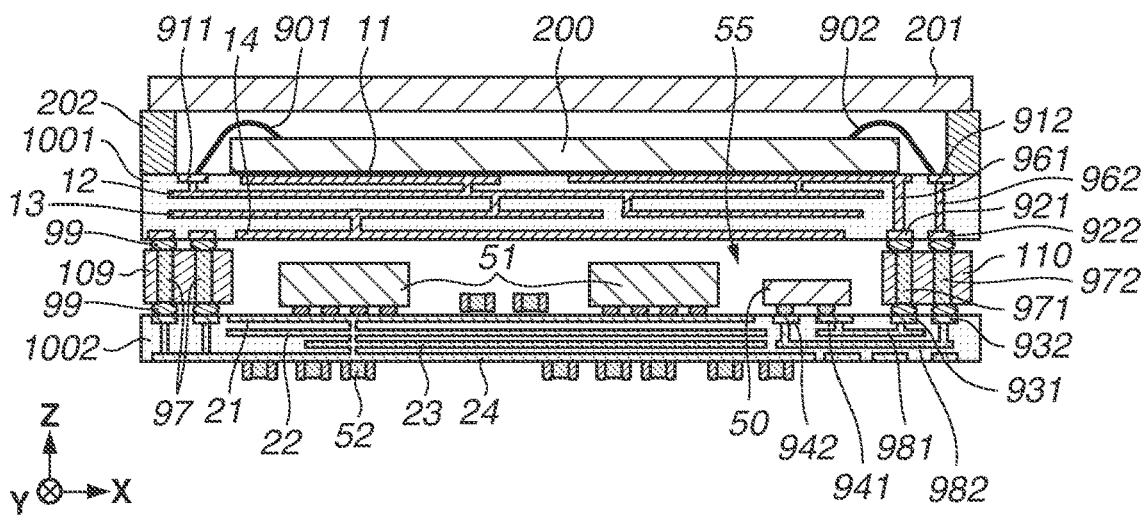
Figure 2C:
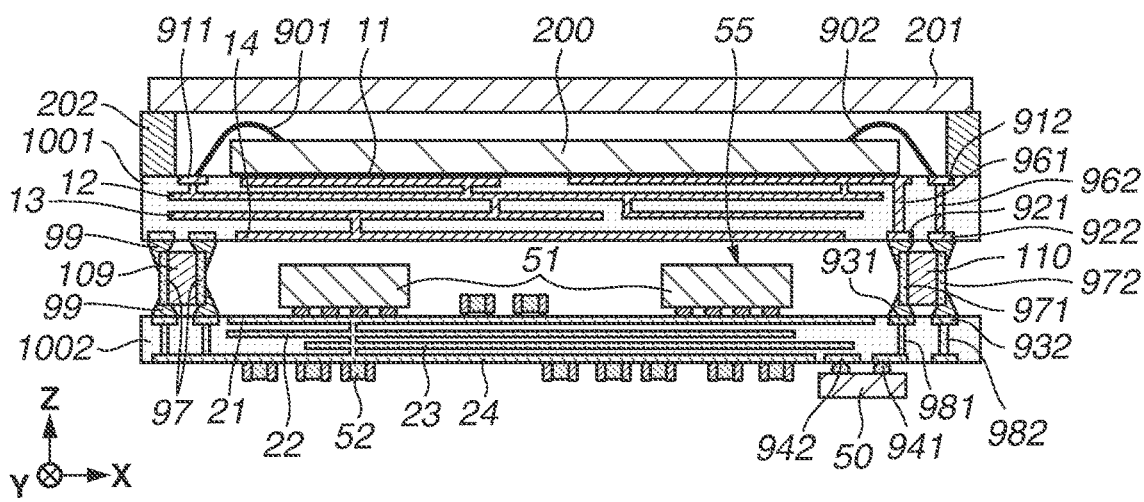

FIG. 2A is a sectional view of the module 300 according to a first exemplary embodiment. FIG. 2B is a sectional view of the module 300 according to a second exemplary embodiment. FIG. 2C is a sectional view of the module 300 according to a third exemplary embodiment.

The module 300 includes the integrated circuit component 200, the wiring board 1001, a cover glass 201, a frame 202, the connection member 110, the wiring board 1002, and the integrated circuit component 50. The integrated circuit component 200 includes an analog circuit. Power for operating the integrated circuit component 200 is supplied via a wire from the integrated circuit component 50.

The connection member 110 includes a power supply wire (first wire) 971 and a ground wire (second wire) 972. The power supply wire 971 supplies a power supply potential from the integrated circuit component 50 to the integrated circuit component 200. The ground wire 972 supplies a ground potential from the integrated circuit component 50 to the integrated circuit component 200.

The cover glass 201 that protects the integrated circuit component 200 is fixed to the wiring board 1001 via the frame 202. The frame 202 serves as a spacer for preventing the integrated circuit component 200 and the cover glass 201 from coming into contact with each other. As a material for the frame 202, resin or ceramics is used. The cover glass 201 and the frame 202 are fixed with adhesive.

The wiring board 1001 includes a conductor portion and an insulator portion.

As the conductor portion, conductive metal, such as copper or gold, is used. As the insulator portion, for example, glass epoxy resin or ceramics is used as a material having electrical insulating properties. In this example, the conductor portion is made of copper and the insulator portion is made of glass epoxy resin. The wiring board 1001 has a substantially quadrangular outer shape. The size (long side, short side, and diagonal length) of the wiring board 1001 is, for example, 10 to 100 mm.

The thickness of the wiring board 1001 is, for example, 200 μm to 2 mm. From the viewpoint of slimming down of the module 300, the wiring board 1001 in the thickness of less than 800 μm is desirable.

On the wiring board 1001, a plurality of conductor layers is disposed at intervals in the Z-direction corresponding to a thickness direction of the wiring board 1001. Each conductor layer includes at least two layers, and an insulator layer is disposed between the two conductor layers. In this example, each conductor layer has four layers. A conductor layer 11, a conductor layer 12, a conductor layer 13, and a conductor layer 14 are stacked and disposed in this order from the integrated circuit component 200. The conductor layer 11 and the conductor layer 14 are surface layers, and a solder resist (not illustrated) may be disposed on the surface of each of the conductor layer 11 and the conductor layer 14. The conductive portion of the wiring board 1001 includes the conductor layers 11, 12, 13, and 14 and vias for connecting the conductor layers 11, 12, 13, and 14, and is used as a wire or an electrode for the wiring board 1001.

The conductor layer 11 is provided with a power supply electrode 911 and a ground electrode 912 that are spaced apart from each other. The conductor layer 14 is provided with a power supply electrode 921 and a ground electrode 922 that are spaced apart from each other. The power supply electrode 911 and the power supply electrode 921 are electrically connected with each other via a power supply wire 961 that is disposed on the wiring board 1001. The ground electrode 912 and the ground electrode 922 are electrically connected with each other via a ground wire 962 that is disposed on the wiring board 1001. The power supply wire 961 and the ground wire 962 are each formed of the conductor portion (conductor layer and/or via) of the wiring board 1001.

The integrated circuit component 200 disposed on the conductor layer 11 is connected to the power supply electrode 911 and the ground electrode 912 disposed on the wiring board 1001, via a conductive member 901 and a conductive member 902, respectively. The conductive member 901 is connected to the power supply electrode 911, and the conductive member 902 is connected to the ground electrode 912. The conductive members 901 and 902 are made of a metal material, such as gold or aluminum, to be electrically connected. In this example, the integrated circuit component 200 is mounted on the wiring board 1001 by wire bonding, and the conductive members 901 and 902 are bonding wires using gold lines or copper lines. However, the configurations of the integrated circuit component 200 and the conductive members 901 and 902 are not limited to these examples. The integrated circuit component 200 may be mounted on the wiring board 1001 by flip-chip bonding, and the conductive members 901 and 902 may be metal bumps made of solder or gold.

The wiring board 1002 includes a conductor portion and an insulator portion. As a material for the conductor portion, conductive metal, such as copper, is used. As a material for the insulator portion, a material having electrical insulating properties, such as glass epoxy resin or ceramics, is used. In this example, the conductor portion is made of copper and the insulator portion is made of glass epoxy resin. The wiring board 1001 has a substantially quadrangular outer shape. The size (long side, short side, and diagonal length) of the wiring board 1002 is, for example, 10 to 100 mm. The size of the wiring board 1002 may be larger or smaller than the size of the wiring board 1001. However, from the viewpoint of downsizing the module 300, the wiring board 1002 in the size of 0.9 to 1.1 times as large as the size of the wiring board 1001 is desirable. The comparison between the size of the wiring board 1001 and the size of the wiring board 1002 can be made in a sectional view when the wiring board 1001 and the wiring board 1002 are superimposed with each other. The thickness of the wiring board 1002 is, for example, 200 μm to 2 mm. From the viewpoint of downsizing the module 300, the wiring board 1001 in the thickness less than 800 μm is desirable.

On the wiring board 1002, a plurality of conductor layers is disposed at intervals in the Z-direction corresponding to a thickness direction of the wiring board 1002. The conductor layers include at least two layers, and an insulator layer is disposed between the two conductor layers. In this example, four conductor layers are formed. A conductor layer 21, a conductor layer 22, a conductor layer 23, and a conductor layer 24 are stacked and disposed in this order from the integrated circuit component 200. The conductor layer 21 and the conductor layer 24 are surface layers, and a solder resist (not illustrated) may be disposed on the surface of each of the conductor layer 21 and the conductor layer 24. The conductor portion of the wiring board 1002 includes the conductor layers 21, 22, 23, and 24 and vias for connecting the conductor layers 21, 22, 23, and 24, and is used as a wire or an electrode for the wiring board 1002.

The conductor layer 21 is provided with a power supply electrode 931 and a ground electrode 932 that are spaced apart from each other. The conductor layer 24 is provided with a power supply electrode 941 and a ground electrode 942 that are spaced apart from each other. The power supply electrode 931 and the power supply electrode 941 are electrically connected with a power supply wire 981 that is disposed on the wiring board 1002. The ground electrode 932 and the ground electrode 942 are electrically connected with a ground wire 982 that is disposed on the wiring board 1002. The power supply wire 981 and the ground wire 982 are formed of the conductor portion (conductor layer and/or via) of the wiring board 1001.

On the wiring board 1002, not only the integrated circuit component 50 and the integrated circuit component 51, but also a passive component 52, such as a resistor or a capacitor, may be mounted. The passive component 52 may be a battery, such as a lithium-ion battery, an all-solid-state battery, or a fuel cell. The passive component 52 serving as a battery may supply power to the integrated circuit component 50. The integrated circuit component 50 is a power supply circuit for supplying power to each analog circuit and each digital circuit included in the integrated circuit component 200, and supplies power for operating the integrated circuit component 200.

In the first and third exemplary embodiments, as illustrated in FIGS. 2A and 2C, the integrated circuit component 50 is connected to each of the power supply electrode 941 and the ground electrode 942 disposed on the conductor layer 24, with conductive members 99 each having conductive properties. As a material for the conductive members 99, solder or conductive resin is used. In the second exemplary embodiment, as illustrated in FIG. 2B, the integrated circuit component 50 is connected to each of the power supply electrode 941 and the ground electrode 942 disposed on the conductor layer 21, with the conductive members 99 each having conductive properties. In the first to third exemplary embodiments, the integrated circuit component 50 overlaps with the integrated circuit component 200. In the first and third exemplary embodiments, the integrated circuit component 50 may overlap with the connection member 110.

The connection member 110 includes conductor portions 97 and an insulator portion 109. As a material for the conductor portions 97 of the connection member 110, conductive metal, such as copper, is used. Each of the conductor portions 97 of the connection member 110 is used as a wire for connecting the wiring board 1001 and the wiring board 1002.

FIGS. 2A to 2C each illustrate the power supply wire 971 and the ground wire 972 as the conductor portions 97 of the connection member 110. The power supply wire 971 and the ground wire 972 are supported by the insulator portion 109. As a material for the insulator portion 109, a material having electrical insulating properties, such as resin or ceramics, is used. Resin used for the insulator portion 109 is thermoplastic resin or thermosetting resin. However, in order to ensure the heat resistance of the insulator portion 109 during the manufacture or use thereof, it is desirable to use thermosetting resin. The connection member 110 according to the present exemplary embodiment includes the insulator portion 109 made of glass epoxy resin. The connection member 110 according to the present exemplary embodiment may be a member obtained by processing a printed wiring board prepared by heat-curing a pre-impregnation including thermosetting resin and patterning a conductor. In the connection member 110 according to another exemplary embodiment, the insulator portion 109 can be prepared by performing injection molding on thermoplastic resin. The connection member 110 can also be prepared by performing insert molding on each of the insulator portion 109 made of thermoplastic resin and the conductor portions 97 that are, for example, metal pins.

As long as the power supply wire 971 and the ground wire 972 of the connection member 110 are disposed between the wiring board 1001 and the wiring board 1002, a wiring path between the wiring board 1001 and the wiring board 1002 can be made as small as possible. Accordingly, it is desirable that the power supply wire 971 and the ground wire 972 do not extend to the outside of an outer edge of each of the wiring board 1001 and the wiring board 1002. On the other hand, the insulator portion 109 of the connection member 110 may include an extending portion that extends to the outside of the outer edge of each of the wiring board 1001 and the wiring board 1002 from a gap between the wiring board 1001 and the wiring board 1002. This extending portion may have a through-hole or the like for fixing or positioning the module 300.

Upper and lower surfaces of the connection member 110 are provided with conductive portions such that conductive portions on the upper surface and respective conductive portions on the lower surface are disposed at the corresponding position in the Z-direction. Each of the conductive portions on the upper surface and the corresponding one of the conductive portions on the lower surface are electrically connected via the corresponding conductor portion 97. Each of the conductive portions on the upper surface of the connection member 110 is connected to the wiring board 1001 via a corresponding one of the conductive members 99, and each of the conductive portions on the lower surface of the connection member 110 is connected to the wiring board 1002 via a corresponding one of the conductive members 99.

The conductor portions 97 formed on the connection member 110 and electrodes of the wiring board 1001 and the wiring board 1002 are electrically connected with each other via the conductive members 99. Among the plurality of conductor portions 97 disposed on the connection member 110, the power supply wire 971 connects the power supply electrode 921 of the wiring board 1001 and the power supply electrode 931 of the wiring board 1002 with each other. In other words, the integrated circuit component 50 supplies a power supply potential to the integrated circuit component 200 via the power supply wire 971. Among the plurality of conductor portions 97 disposed on the connection member 110, the ground wire 972 connects the ground electrode 922 of the wiring board 1001 and the ground electrode 932 of the wiring board 1002 with each other. In other words, the integrated circuit component 50 supplies a ground potential to the integrated circuit component 200 via the power supply wire 971.

The plurality of conductor portions 97 of the connection member 110 can be arrayed with substantially the same pitches (center-to-center distance). In this case, a pitch between two adjacent conductor portions 97 is referred to as an array pitch P. The distance between the adjacent conductor portions 97 can be approximated to half (P/2) of the array pitch P. In a case where N (N≥0) conductor portions 97 are disposed between two conductor portions 97, the pitch (center-to-center distance) between the two conductor portions 97 is represented by (N+1)×P, and the distance between the two conductor portions 97 can be approximated by (N+0.5)×P. The array pitch P is, for example, 10 μm or more. The array pitch P may be 50 μm or more, 100 μm or more, or 300 μm or more. The array pitch P is, for example, 5 mm or less. The array pitch P may be 3 mm or less, or 1 mm or less. Power for operating the integrated circuit component 200 is supplied from the integrated circuit component 50 mounted on the wiring board 1002. The power supply path leads to the power supply electrode 931 and the ground electrode 932 via a wire of the wiring board 1002 from the power supply electrode 941 and the ground electrode 942 to which the integrated circuit component 50 is connected in the wiring board 1002. Next, the path leads to the power supply electrode 921 and the ground electrode 922 through via the power supply wire 971 and the ground wire 972 that extend in the Z-direction in the connection member 110. Next, the path leads to the power supply electrode 911 and the ground electrode 912 via the power supply wire 961 and the ground wire 962 of the wiring board 1001 from the power supply electrode 921 in the wiring board 1001. Further, the path leads to the integrated circuit component 200 via the conductive members 901 and 902 from the power supply electrode 911 and the ground electrode 912.

The module 300 illustrated in FIGS. 2A to 2C can be manufactured using a general surface mount technology (SMT) process. First, solder paste is supplied onto an electrode disposed on one surface of the surface layer of the wiring board 1002 by screen printing or a dispenser. In a subsequent process, conductive portions of electronic components (integrated circuit components 50 and 51 and passive component 52) are disposed and mounted in contact with the supplied solder paste. Next, each of the conductive members 99 is heated to a temperature equal to or higher than the melting point of the conductive member 99, and then is cooled and solidified after melting, to bond the conductive portions of the electronic components and a connection land of the wiring board 1002 with each other. The solder paste can be heated in a reflow furnace.

Next, three processes, i.e., supplying the above-described solder paste, mounting of components, and heating, are performed on the unmounted surface of the wiring board 1002, to bond the electronic components and the connection member 110 with together. Since the connection member 110 can be bonded in the same process as that for the electronic components, the connection member 110 can be bonded simultaneously with the other electronic components.

A method for bonding the wiring board 1002 including the connection member 110 manufactured by the above-described processes with the wiring board 1001 on which the integrated circuit component 200 and the cover glass 201 are mounted will be described below. First, solder paste is supplied onto an electrode for the connection member 110 disposed on the surface layer of the wiring board 1001 by screen printing or a dispenser. Next, the electrode for the connection member 110 that is integrated with the wiring board 1002 is positioned and mounted at the position corresponding to the supplied solder paste. After that, each conductive member 99 is heated to the melting point or higher, and is cooled and solidified after melting, to bond the wiring board 1001 and the wiring board 1002 with each other together.

Figure 3A:
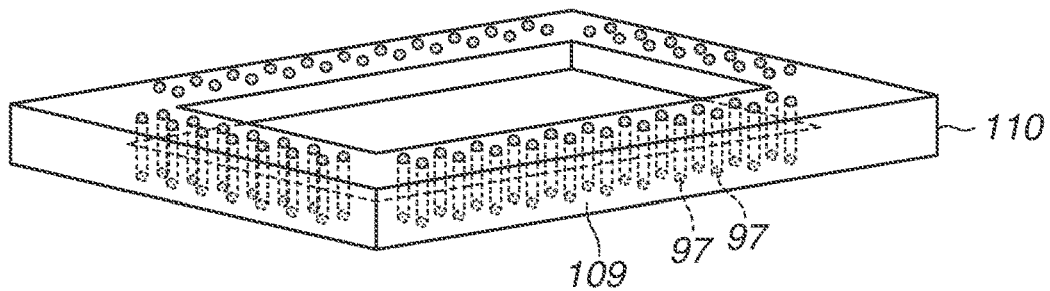
FIGS. 3A to 3C are schematic diagrams illustrating configuration examples of connection members according to the present exemplary embodiments.
Figure 3B:
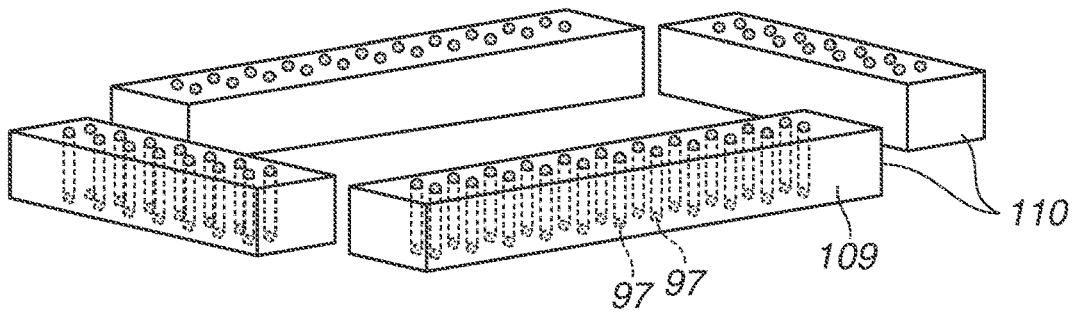
Figure 3C:
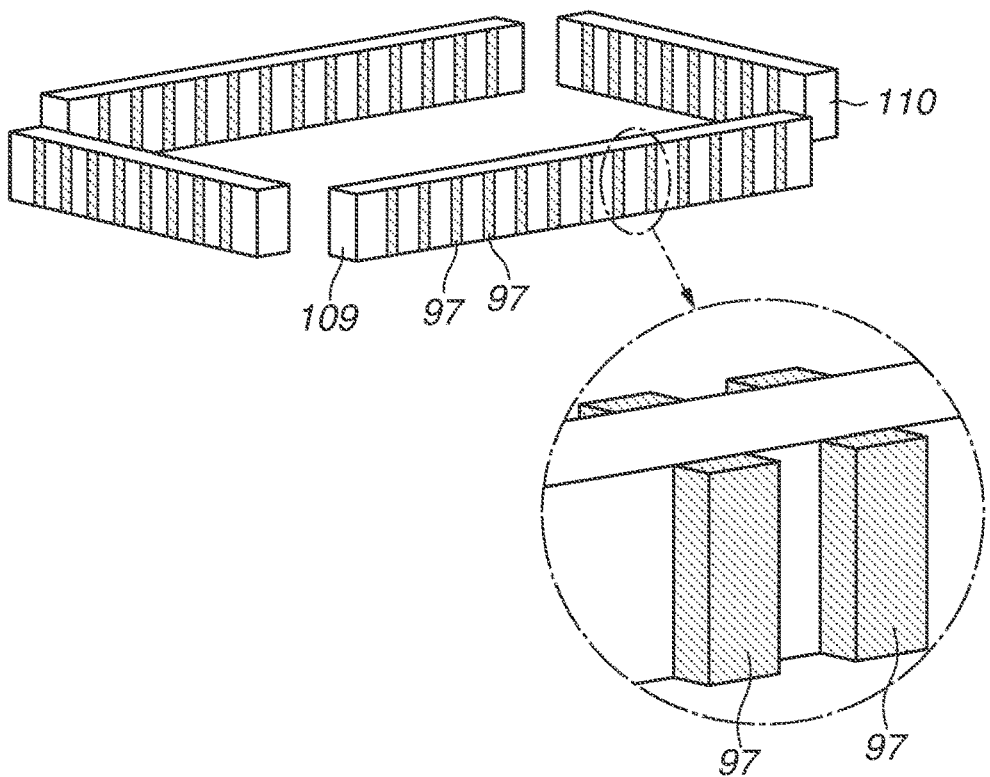

FIGS. 3A, 3B, and 3C are perspective views illustrating configuration examples of the connection member 110.

The connection member 110 illustrated in FIG. 3A has a frame body structure. To connect the connection member 110, the wiring board 1001, and the wiring board 1002 with each other, a plurality of connection portions is disposed on the upper surface and the lower surface of the connection member 110. The conductive portions facing each other on the upper and lower surfaces are connected with the conductor portions 97 of the connection member 110. For example, a through-hole may be formed to electrically connect the upper and lower surfaces by copper plating, or a copper bar may be buried in the through-hole, instead of using plating.

The connection member 110 illustrated in FIG. 3B has a rectangular parallelepiped shape. A plurality of connection members 110 may be used as needed. The conductive portions to be connected to the wiring board are formed on the upper and lower surfaces like in FIG. 3A, and the conductive portions facing each other on the upper and lower surfaces are connected with the conductor portions 97 of the connection member 110. For example, a through-hole may be formed to electrically connect the upper and lower surfaces with each other by copper welding, or a copper bar may be buried in the through-hole, instead of using plating.

The connection member 110 illustrated in FIG. 3C has a rectangular parallelepiped shape like in FIG. 3B. Each conductive portion has a rectangular shape, and the conductive portions on the upper and lower surfaces are electrically connected with the conductor portions 97 formed on side surfaces of the connection member 110. For example, the conductor portions 97 of the connection member 110 may be formed by etching copper foil bonded onto the surface of the insulator portion 109, or may be formed by plating.

The integrated circuit component 200 is mounted on the wiring board 1001, and the integrated circuit component 50 is mounted on the wiring board 1002. The wiring board 1001 and the wiring board 1002 are connected via the connection member 110. In other words, the gap 55 occupies a major part of the space between the wiring board 1001 and the wiring board 1002, and a main heat transfer path between the wiring board 1001 and the wiring board 1002 is to the connection member 110.

Accordingly, even in a case where the integrated circuit component 200 generates heat, since the gap 55 having a high heat resistance is interposed, effects of heat on the integrated circuit component 50 can be reduced or prevented. Reducing or suppressing Johnson noise by reducing or preventing temperature variations in the integrated circuit component 50 makes it possible to stabilize operation of the integrated circuit component 200.

Next, inductive noise will be described in detail. Power for operating the integrated circuit component 200 is supplied from the integrated circuit component 50 that is bonded onto the wiring board 1002. The power supply path leads to the power supply electrode 931 via a wire of the wiring board 1002 from the corresponding power supply electrode that connects the integrated circuit component 50 in the wiring board 1002. Next, the path leads to the power supply electrode 921 via the conductor portions 97 each of which connects the corresponding electrodes on the upper and lower surfaces of the connection member 110. Next, the path leads to the power supply electrode 911 via a wire of the wiring board 1001 and a first via conductor 96 from the power supply electrode 921, and further leads to the integrated circuit component 200 via a wire in the wiring board 1001. In this case, a closed loop control system is formed by a wire leading from the integrated circuit component 50 to the integrated circuit component 200, and $\Phi = B \times S$ holds where an area of the closed loop control system is represented by S, a magnetic flux density is represented by B, and a magnetic flux that interlinks with the closed loop control system is represented by $\Phi$. In other words, the magnetic flux $\Phi$ is proportional to the area S of the closed loop control system. When the magnetic flux $\Phi$ interlinks with the closed loop control system, induced electromotive power V in accordance with a time variation of the magnetic flux $\Phi$ is generated in the closed loop control system of the wire. This follows Faraday's law of induction. A relationship between the induced electromotive power V and a variation $\Delta\Phi$ of the magnetic flux $\Phi$ at a small time $\Delta t$ is represented by $V=-\Delta\Phi/\Delta t$. Since $\Delta\Phi$ is proportional to the area S of the closed loop control system, the induced electromotive power V generated in the closed loop control system is also proportional to the area S of the closed loop. By the Ohm's law, the relationship among the induced electromotive power V generated in the closed loop control system, an impedance R of the closed loop control system, and an induced current I that flows through the closed loop control system is represented by I=V/R. Since the induced current I is inversely proportional to the impedance R, the induced current I is more likely to flow as the impedance R decreases. When the magnetic flux $\Phi$ is oriented in an opposite direction by 180 degrees, the induced electromotive power V and the induced current I are oriented in opposite directions. Also, when the magnetic flux $\Phi$ reaches obliquely with respect to the plane of the closed loop control system, the induced electromotive power V is generated in accordance with a component in a direction perpendicular to the loop plane of the magnetic flux $\Phi$.

The integrated circuit component 200 may include an analog circuit with a low resistance to the magnetic flux $\Phi$. Accordingly, in a case where the magnetic flux $\Phi$ increases, inductive noise is generated in the analog circuit of the integrated circuit component 200, which leads to deterioration in stable operation of the integrated circuit component 200. In another case, noise can be superimposed on a signal in the analog circuit. In a case where the integrated circuit component 200 is an image capturing device or a display device, the image quality may deteriorate. It is desirable to reduce the area of the closed loop control system to suppress effects due to the inductive noise. The configuration in which the integrated circuit component 50 overlaps with the wiring board 1001 makes it possible to reduce or prevent an increase in the area of the closed loop control system and thus to reduce inductive noise. The configuration in which the integrated circuit component 50 is disposed at a position overlapping with the wiring board 1001 also makes it possible to shorten the power supply path from the integrated circuit component 50 to the integrated circuit component 200, whereby more stable power supply can be achieved. With the configuration in which the integrated circuit component 50 overlaps with the connection member 110, the area of the closed loop control system can be further reduced.

Figure 4A:
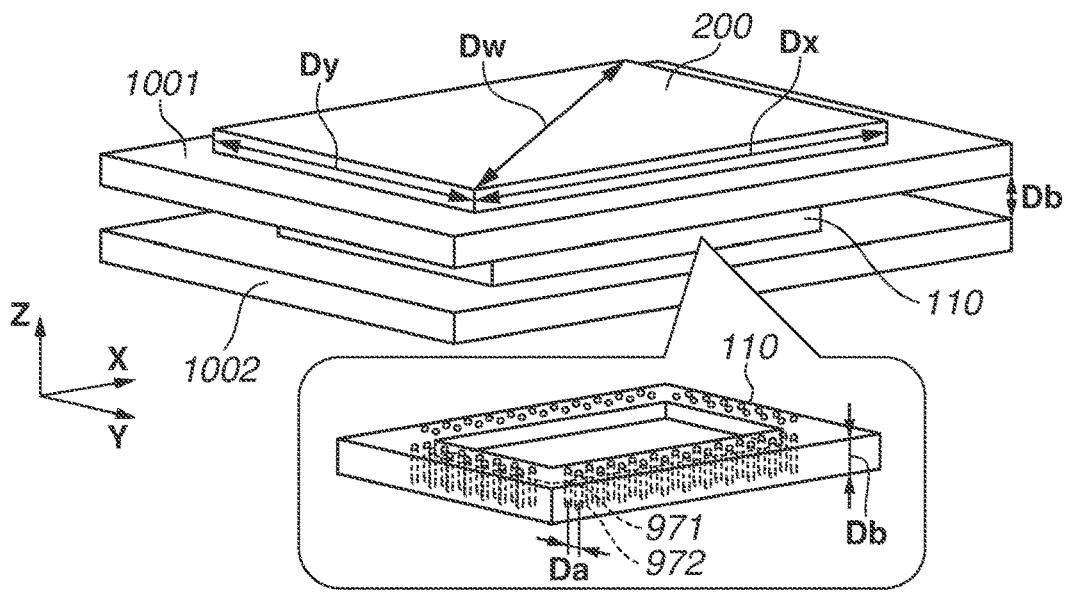
FIG. 4A is a diagram illustrating a perspective view of the module according to the present exemplary embodiment.
Figure 4B:
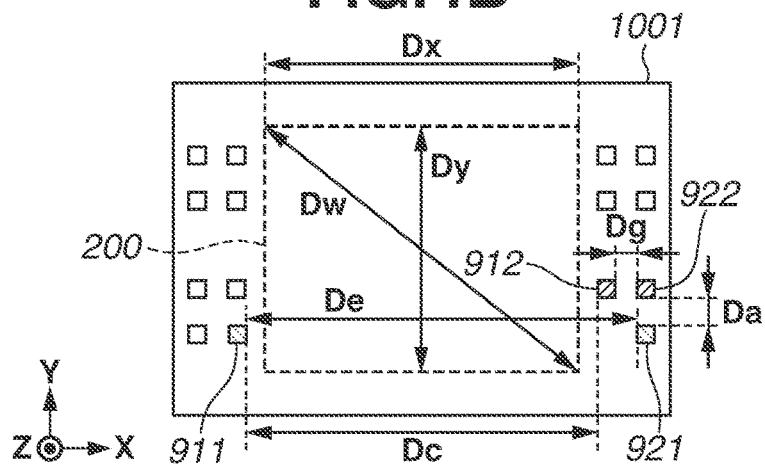
FIGS. 4B and 4C are diagrams each illustrating a plan view of a wiring board according to the present exemplary embodiment.
Figure 4C:
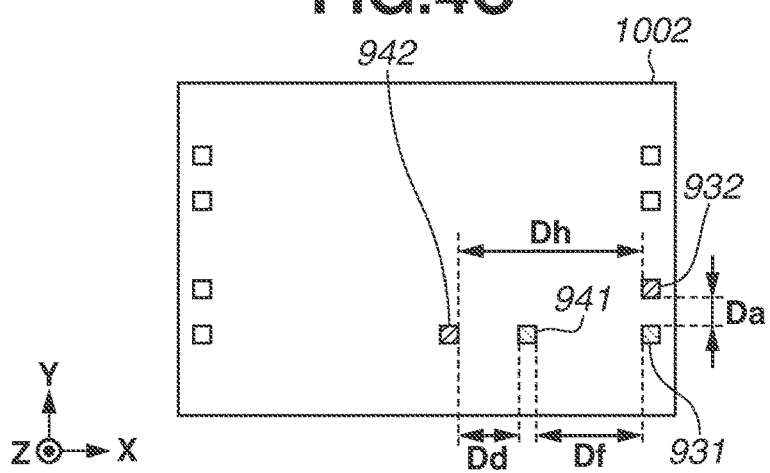

FIG. 4A is a perspective view of the module 300. The integrated circuit component 200 may have a quadrangular outer shape. The size of the diagonal length of the integrated circuit component 200 is represented by Dw. In a planer view of the integrated circuit component 200, the size of a first side is represented by Dx and the size of a second side intersecting with the first side is represented by Dy. FIG. 4B is a plan view of the wiring board 1001. FIG. 4C is a plan view of the wiring board 1002. Examples illustrated in FIGS. 4B and 4C each illustrate an arrangement desirable for electrodes and wires to reduce thermal noise and inductive noise in the module 300.

To reduce effects of inductive noise, it is desirable that a distance Da between the power supply wire 971 and the ground wire 972 is smaller than the size Dw of the integrated circuit component 200 (Da<Dw). It is desirable that the distance Da between the power supply wire 971 and the ground wire 972 is smaller than the size Dx of the integrated circuit component 200 (Da<Dx). It is desirable that the distance Da between the power supply wire 971 and the ground wire 972 is smaller than the size Dy of the integrated circuit component 200 (Da<Dy).

Figure 5A:
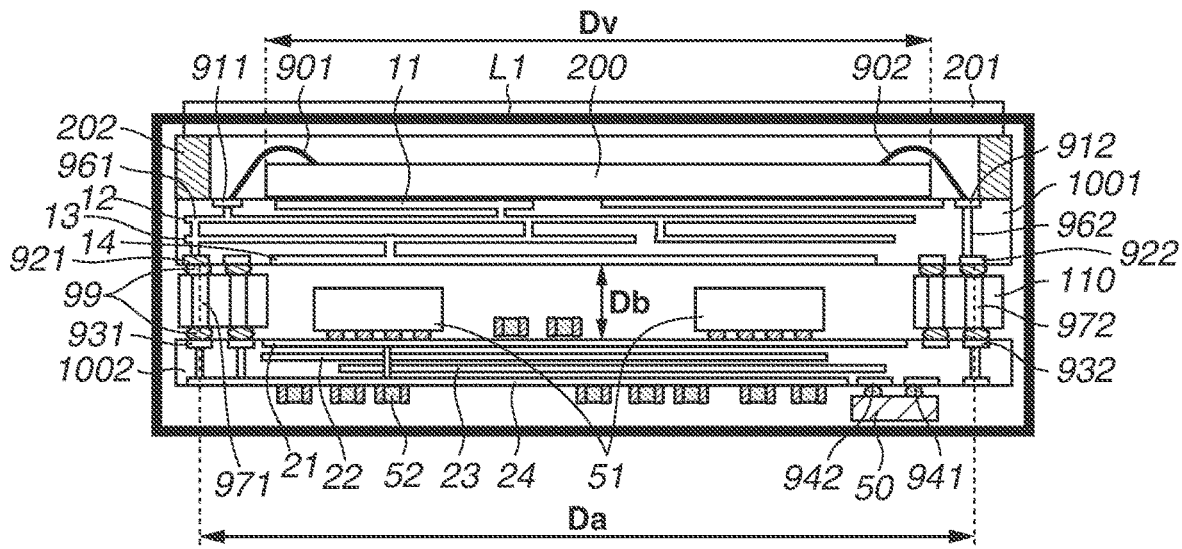
FIGS. 5A to 5C are schematic diagrams illustrating the modules according to the present exemplary embodiments.
Figure 5B:
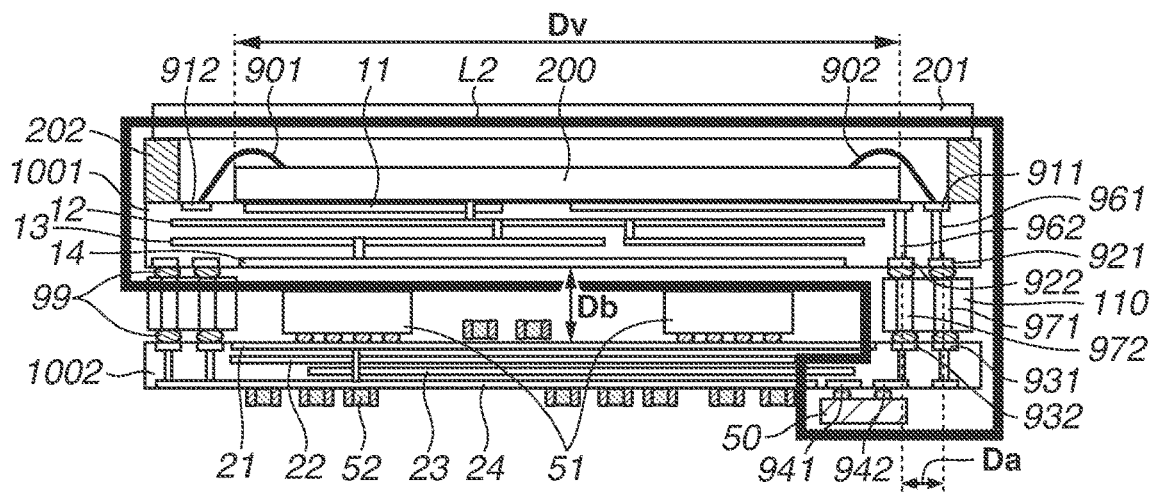
Figure 5C:
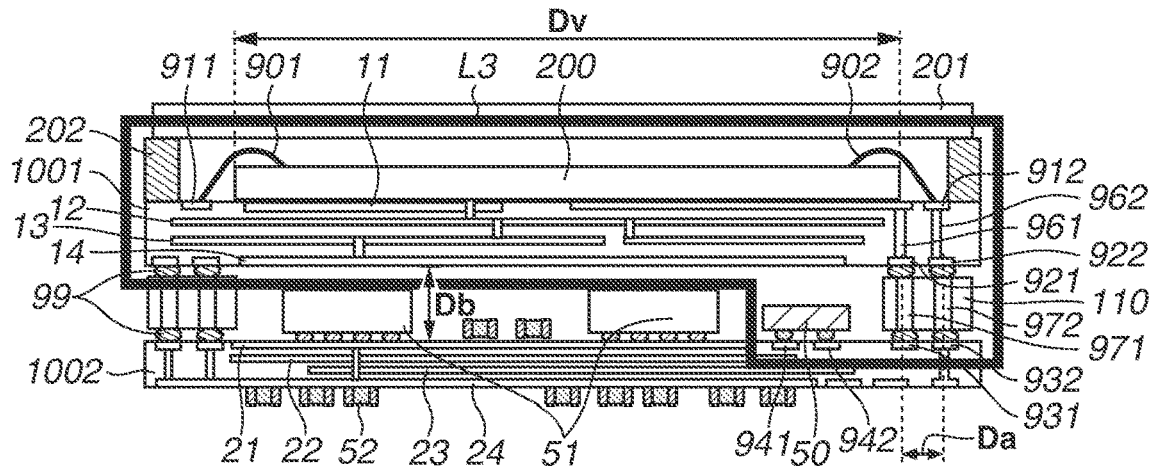

As illustrated in FIG. 5A, in a case where the distance Da between the power supply wire 971 and the ground wire 972 is larger than a size Dv (Dv is any one of Dw, Dx, and Dy) of the wiring board 1001 (Da>Dv), a large closed loop control system L1 is formed. Consequently, inductive noise can be generated. On the other hand, as illustrated in FIGS. 5B and 5C, in a case where the distance Da between the power supply wire 971 and the ground wire 972 is smaller than the size Dv (Dv is any one of Dw, Dx, and Dy) of the integrated circuit component 200 (Da<Dv), small closed loop control systems L2 and L3 can be formed. As illustrated in FIG. 5C, in a case where the integrated circuit component 50 is disposed between the wiring board 1001 and the wiring board 1002, the width of the closed loop control system L3 in the Z-direction can be reduced as compared with the closed loop control system L1, which is advantageous in reducing inductive noise.

To effectively reduce inductive noise, the distance Da may be set to satisfy the following expression (1):

$$Da \leq \frac{\sqrt{Dx^2 + Dy^2}}{10} = 10/Dw \quad (1)$$

In other words, the distance Da having the size less than or equal to 1/10 of the size Dw (Da≤Dw/10) is desirable. At least one of the sizes Dw, Dx, and Dy is, for example, 1 mm or more, and may be 5 mm or more, 10 mm or more, 25 mm or more, 100 mm or less, or 50 mm or less. The distance Da is, for example, 50 mm or less, and may be 10 mm or less, 5 mm or less, 3 mm or less, or 1 mm or less. The distance Da is, for example, 10 μm or more, and may be 50 μm or more, 100 μm or more, or 200 μm or more.

As for the array pitch P between the conductor portions 97 of the connection member 110, when N (N≥0) conductor portions 97 are disposed between the power supply wire 971 and the ground wire 972, the distance Da can be approximated by (N+0.5)×P. The number N of the conductor portions 97 disposed between the power supply wire 971 and the ground wire 972 satisfying 0≤N≤3 is desirable. In a case where one conductor portion 97 is disposed between the power supply wire 971 and the ground wire 972, the distance Da is approximately 1.5×P.

Even in a case where the connection member 110 has a different structure, when the distance Da between the power supply wire 971 and the ground wire 972 and the size of the integrated circuit component 200 satisfy the above-described expression (1), effects of inductive noise can be sufficiently reduced or prevented. The distance Da less than or equal to 1/10 of at least one of the size Dx and the size Dy (Da≤Dx/10, Da≤Dy/10) is desirable. The distance Da less than or equal to 1/10 of at least one of the size Dx and the size Dy is desirable. Further, the distance Da between the power supply wire 971 and the ground wire 972 smaller than a distance Db between the wiring board 1001 and the wiring board 1002 (Da<Db) is desirable. The distance Da may be less than or equal to 1/2 of the distance Db (Da≤Db/2), and the distance Da may be less than or equal to 1/4 of the distance Db (Da≤Db/4). Thus, minimizing the distance Da is advantageous in reducing effects of inductive noise. The distance Db between the wiring board 1001 and the wiring board 1002 can be approximated to a thickness of the connection member 110. It may be desirable to maximize the distance Db to reduce or prevent heat conduction from the wiring board 1001 to the wiring board 1002. The distance Db and the thickness of the connection member 110 may be larger than the thickness of the wiring board 1001, and may be larger than the thickness of the wiring board 1002. The distance Db is, for example, 500 μm or more. The distance Db may be 1 mm or more, 3 mm or less, or 5 mm or less.

As illustrated in FIG. 4B, a distance between the power supply electrode 921 and the ground electrode 922 can be approximated to the distance Da between the power supply wire 971 and the ground wire 972. On the other hand, a distance Dc between the power supply electrode 911 and the ground electrode 912 can be set independently of the distance Da. In the present exemplary embodiment, the distance Dc is longer than the distance Da (Dc>Da), and the distance Dc may be twice or more as large as the distance Da (Dc≥2×Da). However, the distance Dc may be smaller than the distance Da (Dc<Da), and the distance Dc may be less than or equal to half of the distance Da (Dc≤Da/2). The distance Dc may be larger than half of the distance Da (Dc>Da/2), and the distance Dc may be smaller than twice the distance Da (Dc>Da/2).

As illustrated in FIG. 4C, the distance between the power supply electrode 931 and the ground electrode 932 may also be approximated to the distance Da between the power supply wire 971 and the ground wire 972. On the other hand, a distance Dd between the power supply electrode 941 and the ground electrode 942 can be set independently of the distance Da. In the present exemplary embodiment, the distance Dd may be larger than the distance Da (Dd>Da), and the distance Dd may be twice or more as large as the distance Da (Dd≥2×Da). However, the distance Dd may be smaller than the distance Da (Dd<Da), and the distance Dd may be less than or equal to half of the distance Da (Dd≤Da/2). The distance Dd may be larger than half of the distance Dd (Dd>Da/2), and the distance Dd may be smaller than twice the distance Da (Dd>Da/2). In the present exemplary embodiment, the distance Dc may be larger than the distance Dd (Dc>Dd), or the distance Dc may be smaller than the distance Dd (Dc<Dd).

In the present exemplary embodiment, a distance De between the power supply electrode 921 and the power supply electrode 911 is larger than the size Dx (De>Dx), but instead may be smaller than the size Dx (De<Dx). While the distance De is smaller than the size Dw (De<Dw) in the present exemplary embodiment, the distance De may be larger than the size Dw (De>Dw). While the distance De is larger than the distance Da (De>Da) in the present exemplary embodiment, the distance De may be smaller than the distance Da (De<Da). In the present exemplary embodiment, a distance Df between the power supply electrode 931 and the power supply electrode 941 is larger than the distance Dd (Df>Dd), the distance Df may be smaller than the distance Dd (Df<Dd). While the distance Df is larger than the distance Da (Df>Da) in the present exemplary embodiment, the distance Df may be smaller than the distance Da (Df<Da). The distance Dd is, for example, 100 μm or more, and may be 300 μm or more. The distance Dd is, for example, 10 mm or less, and may be 5 mm or less, 3 mm or less, or 1 mm or less.

In the present exemplary embodiment, a distance Dg between the ground electrode 922 and the ground electrode 912 is smaller than the size Dx (Dg<Dx), but the distance Dg may be larger than the size Dx (Dg>Dx). While the distance Dg is smaller than the size Dw (Dg<Dw) in the present exemplary embodiment, the distance Dg may be larger than the size Dw (Dg>Dw). While the distance Dg is larger than the distance Da (Dg>Da) in the present exemplary embodiment, the distance Dg may be smaller than the distance Da (Dg<Da). In the present exemplary embodiment, a distance Dh between the ground electrode 932 and the ground electrode 942 is larger than the distance Dd (Dh>Dd), the distance Dh may be smaller than the distance Dd (Dh<Dd). While the distance Dh is larger than the distance Da (Dh>Da) in the present exemplary embodiment, the distance Dh may be smaller than the distance Da (Dh<Da).

The area of the closed loop control system can also be reduced by reducing the distance Dc between the power supply electrode 911 and the ground electrode 912. To reduce effects of inductive noise, the distance Dc between the power supply electrode 911 and the ground electrode 912 smaller than the size Dw of the integrated circuit component 200 (Dc<Dw) is desirable. The distance Dc smaller than the size Dx (Dc<Dx) is also desirable. Further, the distance Dc smaller than the size Dy of the integrated circuit component 200 (Dc<Dy) is desirable. However, in the present exemplary embodiment, since the power supply potential and the ground potential are supplied to the both sides of the integrated circuit component 200, the distance Dc between the power supply electrode 911 and the ground electrode 912 is set to be larger than the size Dx of the integrated circuit component 200 (Dc>Dx).

A method for reducing the distances (Da, Dc) between the path for supplying the power supply potential and the path for supplying the ground potential to reduce the area of the closed loop control system has been described above. However, the method is not particularly limited. The area of the closed loop control system can also be reduced by decreasing the length of the path for supplying the power supply potential, or by decreasing the length of the path for supplying the ground potential. The length of the path for supplying the power supply potential in the closed loop control system is substantially dependent on the sum of the distance Df, the distance Db, and the distance De. The length of the path for supplying the ground potential in the closed loop control system is substantially dependent on the sum of the distance Dd, the distance Dh, and the distance Dg. Accordingly, for example, decreasing the distance De and the distance Df that occupy the path for supplying the power supply potential is also effective to reduce noise. Decreasing the distance Df and the distance Dh that occupy the path for supplying the ground potential is also effective to reduce noise. Decreasing the distance Db is also effective to reduce noise. The distance Db can be set to, for example, 1 to 5 mm. The distance Db may be smaller than the size Dv (Db<Dv), and may be smaller than the distance Dd (Db<Dd).

To decrease at least one of the distance De and the distance Dg, at least one of the power supply electrode 911 and the ground electrode 912 may be disposed at a position overlapping with the connection member 110. To decrease at least one of the distance Dd and the distance Dh, at least one of the power supply electrode 941 and the ground electrode 942 may be disposed at a position overlapping with the connection member 110. As illustrated in FIGS. 1A, 2A, and 2C, the configuration, in which the wiring board 1001 and the wiring board 1002 are disposed between the integrated circuit component 200 and the integrated circuit component 50, is desirable because at least one of the power supply electrode 911 and the ground electrode 912 and at least one of the power supply electrode 941 and the ground electrode 942 can be disposed at a position overlapping with the connection member 110. While the distance De is dependent on the size Dv of the integrated circuit component 200, it is desirable that the distance Df is smaller than the distance De (Df<De), as long as the position of the integrated circuit component 50 on the wiring board 1001 can be appropriately set. Thus, the path for supplying the power supply potential can be shortened as much as possible. Heat generated in the integrated circuit component 200 can be transmitted to the wiring board 1002 via the wiring board 1001 and the connection member 110. Accordingly, to reduce or prevent transmission of heat generated in the integrated circuit component 200 to the integrated circuit component 50, it is desirable that the integrated circuit component 50 is spaced apart from the connection member 110. Thus, the distance Df larger than the distance Dd (Df>Dd) is desirable.

The area of the closed loop control system can be reduced by decreasing the distance Da between the power supply wire 971 and the ground wire 972. As described above, the area of the closed loop control system can be reduced by satisfying at least one of Da<Dv, Da≤Dv/10 (Dv is any one of Dw, Dx, and Dy), Da<Db, Da≤Db/2, and Da≤Db/4. As for the sizes and distances illustrated in FIG. 4B, it is also desirable to satisfy, for example, a relationship (Da, Dd, Dg)<(Db, Df, Dh)<(Dc, De)<Dv. In this case, "(A, B)<(C, D)" indicates that at least one of "A" and "B" is smaller than at least one of "C" and "D", and "A" to "D" correspond to any one of the above-described distances and sizes.

Figure 6A:
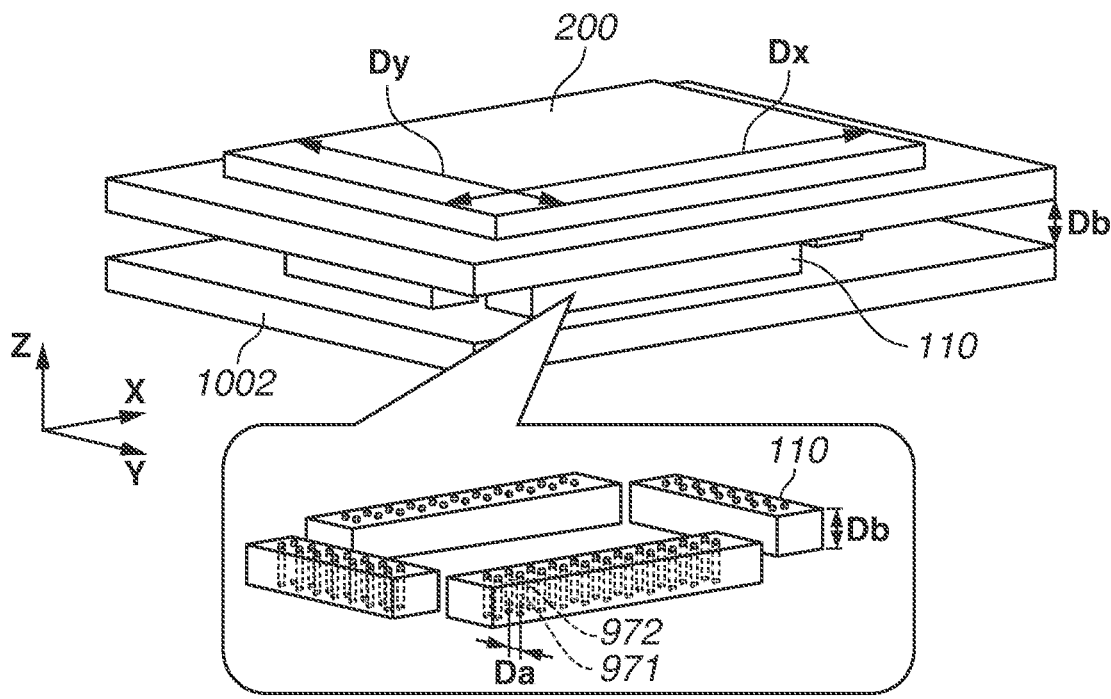
FIGS. 6A and 6B are schematic diagrams illustrating the modules according to the present exemplary embodiments.
Figure 6B:
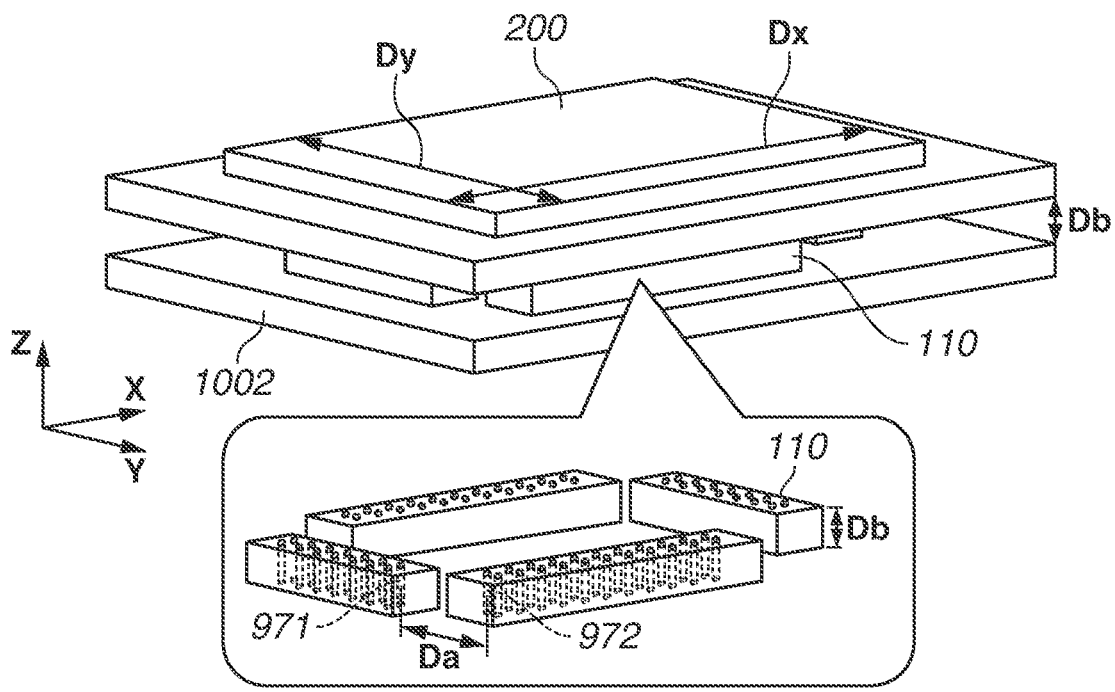

For example, as for the connection member 110 having a rectangular parallelepiped shape as illustrated in FIG. 6A, the power supply wire 971 and the ground wire 972 for supplying power to the integrated circuit component 200 may be disposed in the same connection member 110 in such a manner that the distance Da satisfies the above-described expression (1). As illustrated in FIG. 6B, the power supply wire 971 and the ground wire 972 each disposed on a different connection member 110 may also be used.

Figure 7A:
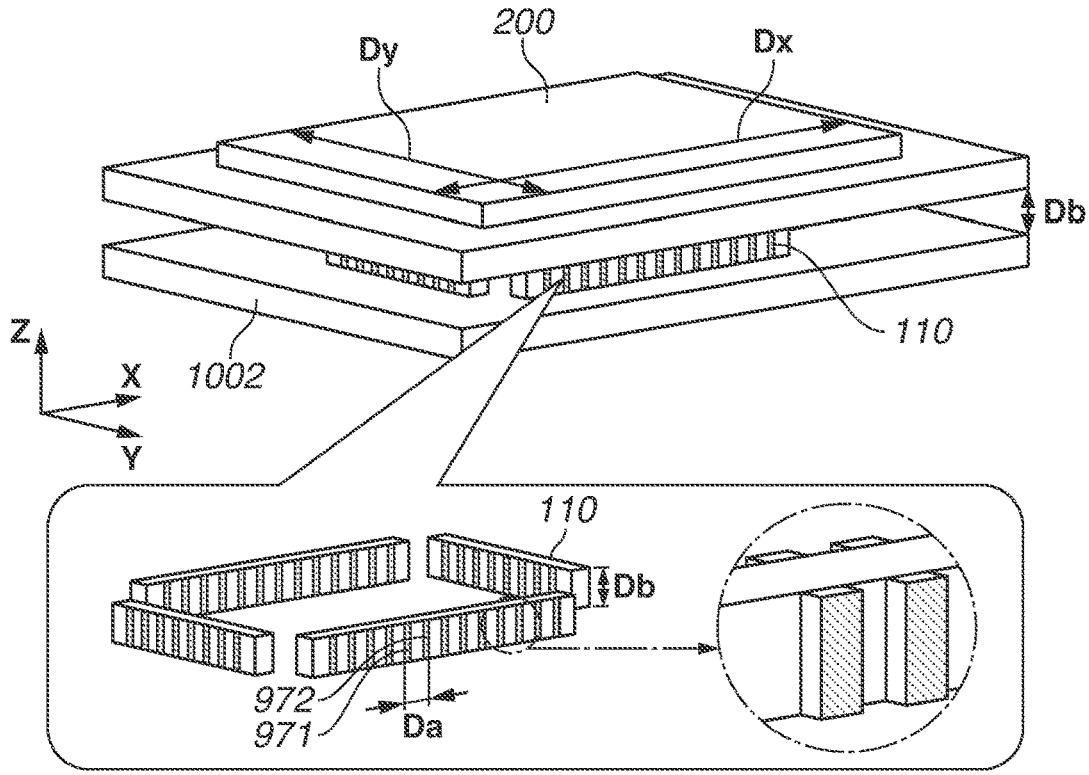
FIGS. 7A and 7B are schematic diagrams illustrating the modules according to the present exemplary embodiments.
Figure 7B:
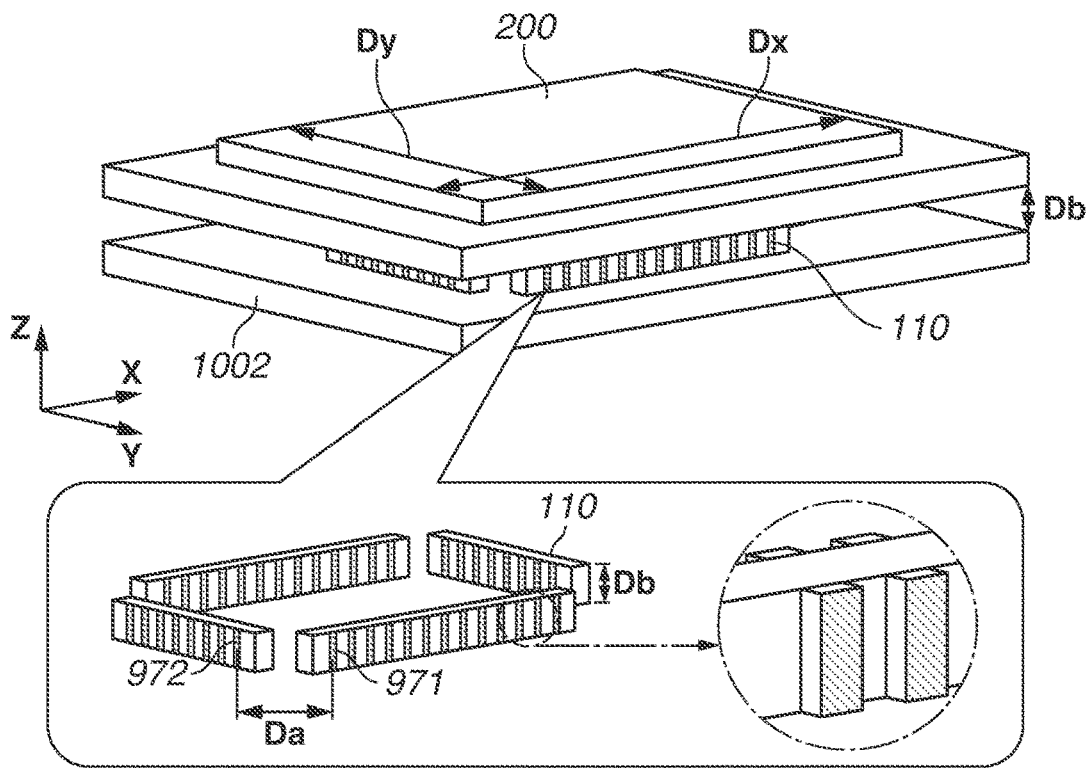

In a case where each electrode has a rectangular shape and the connection member 110 has a rectangular parallelepiped shape as illustrated in FIG. 7A, the power supply wire 971 and the ground wire 972 for supplying power to the integrated circuit component 200 may be disposed in the same connection member 110 in such a manner that the distance Da satisfies the above-described expression (1). Alternatively, the power supply wire 971 and the ground wire 972 each disposed on a different connection member 110 as illustrated in FIG. 7B may be used. Using the module 300 having the above-described configuration makes it possible to reduce or prevent transmission of heat generated in the integrated circuit component 200 to the integrated circuit component 50, which reduces or suppresses generation of Johnson noise in the integrated circuit component 50, whereby deterioration in operation stability of the integrated circuit component 200 can be reduced.

In the descriptions with reference to FIGS. 2A to 2C to 7A and 7B, the wiring path including the power supply wire 971 is described as an example of a path for supplying a power supply potential, and the wiring path including the ground wire 972 is described as an example of a path for supplying a ground potential. However, the wiring path including the power supply wire 971 may be used as the path for supplying a ground potential, and the wiring path including the ground wire 972 may be used as the path for supplying a power supply potential.

Figure 8A:
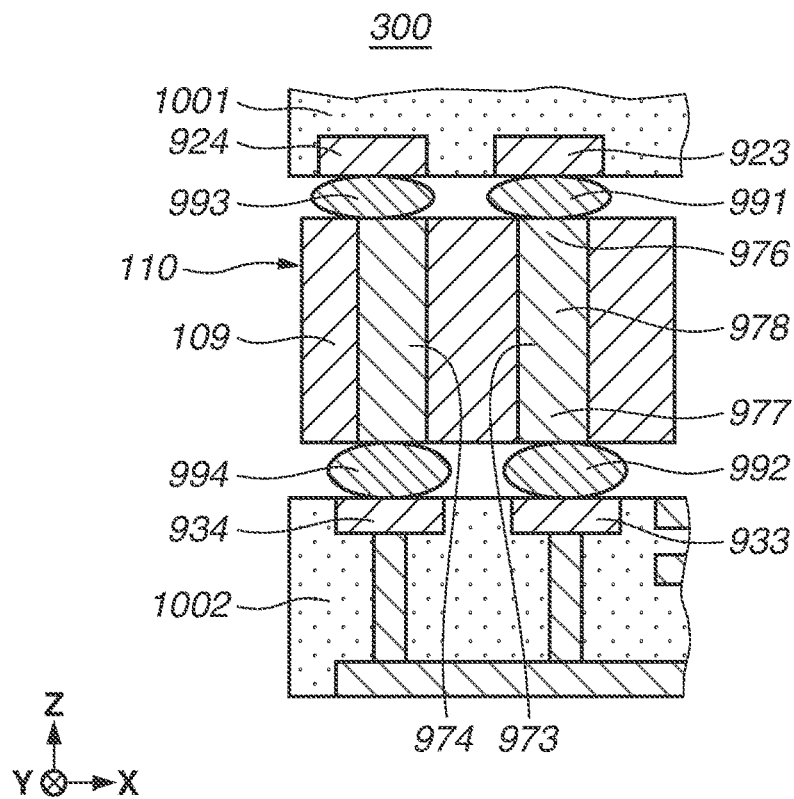
FIGS. 8A and 8B are schematic diagrams illustrating enlarged views of connection portions according to the present exemplary embodiments.
Figure 8B:
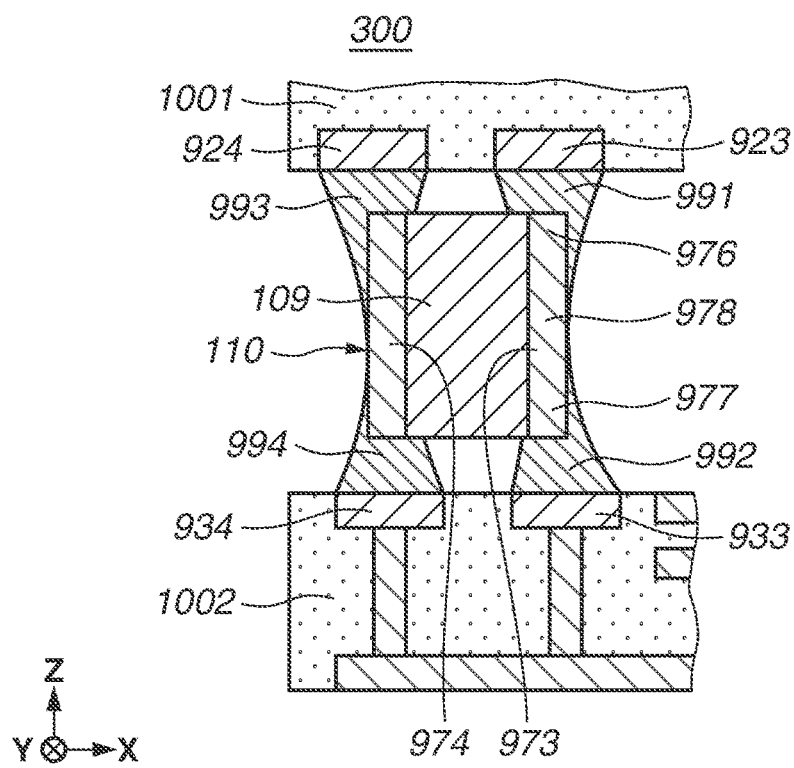

FIG. 8A is an enlarged view of a connection portion where the connection member 110, the wiring board 1001, and the wiring board 1002 are connected in the first exemplary embodiment illustrated in FIG. 2A or in the second exemplary embodiment illustrated in FIG. 2B. FIG. 8B is an enlarged view of the connection portion where the connection member 110, the wiring board 1001, and the wiring board 1002 are connected in the third exemplary embodiment illustrated in FIG. 2C.

Matters common to the first to third exemplary embodiments will be described. The wiring board 1001 includes connection electrodes 923 and 924, and the wiring board 1002 includes connection electrodes 933 and 934. The connection member 110 includes connection wires 973 and 974 as the plurality of conductor portions 97, and the insulator portion 109 that supports the plurality of conductor portions 97 (connection wires 973 and 974). The connection wire 973 includes a conductive portion 976, a conductive portion 977, and a conductive portion 978, which is disposed between the conductive portion 976 and the conductive portion 977, along the Z-direction in which the wiring board 1001 and the wiring board 1002 overlap with each other. The conductive portion 976 is connected to the connection electrode 923 of the wiring board 1001 via a conductive member 991. The conductive member 991 is in contact with the conductive portion 976 and the connection electrode 923. The conductive portion 977 is connected to the connection electrode 933 of the wiring board 1002 via a conductive member 992. The conductive member 992 is in contact with the conductive portion 977 and the connection electrode 933. The conductive members 991 and 992 are examples of the conductive members 99 described above. For example, the conductive members 991 and 992 are solder bumps in the first and second exemplary embodiments, and are solder fillets in the third exemplary embodiment. The conductive members 991 and 992 are separated from each other and the conductive members 991 and 992 are not in contact with a conductive portion 978. In the Z-direction, the conductive member 991 is disposed between the connection electrode 923 and the conductive portion 976. In the Z-direction, the conductive member 992 is located between the connection electrode 933 and the conductive portion 977. Thus, the connection electrode 923, the conductive member 991, the conductive portion 976, the conductive portion 978, the conductive portion 977, the conductive member 992, and the connection electrode 933 are arranged in the Z-direction. Accordingly, the wiring path between the wiring board 1001 and the wiring board 1002 can be shortened and the packaging density of connection wires can be increased. While the connection wire 973 is described in detail in the present exemplary embodiment, the connection wire 974 has a configuration similar to that of the connection wire 973. The connection wire 974 is connected to the connection electrode 924 of the wiring board 1001 via a conductive member 993, and is connected to the connection electrode 934 of the wiring board 1002 via a conductive member 994. The conductive members 993 and 994 are also examples of the conductive members 99 described above. For example, the conductive members 993 and 994 are solder bumps in the first and second exemplary embodiments, and are solder fillets in the third exemplary embodiment.

The third exemplary embodiment illustrated in FIG. 8B differs from the first and second exemplary embodiments in that the conductive members 99 are in contact with side surfaces of the connection member 110. Specifically, in the X-direction perpendicular to the Z-direction, the conductive portion 976 is disposed between the conductive member 991 and the insulator portion 109. In the X-direction perpendicular to the Z-direction, the conductive portion 977 is disposed between the conductive member 992 and the insulator portion 109. In a modified example of the third exemplary embodiment, in the Z-direction, the conductive member 991 may be disposed to a position not between the connection electrode 923 and the conductive portion 976, and the connection electrode 923 and the conductive portion 976 may be in contact with each other. In the Z-direction, the conductive member 992 may be disposed at a position not between the connection electrode 933 and the conductive portion 977, and the connection electrode 933 and the conductive portion 977 may be in contact with each other.

Figure 9A:
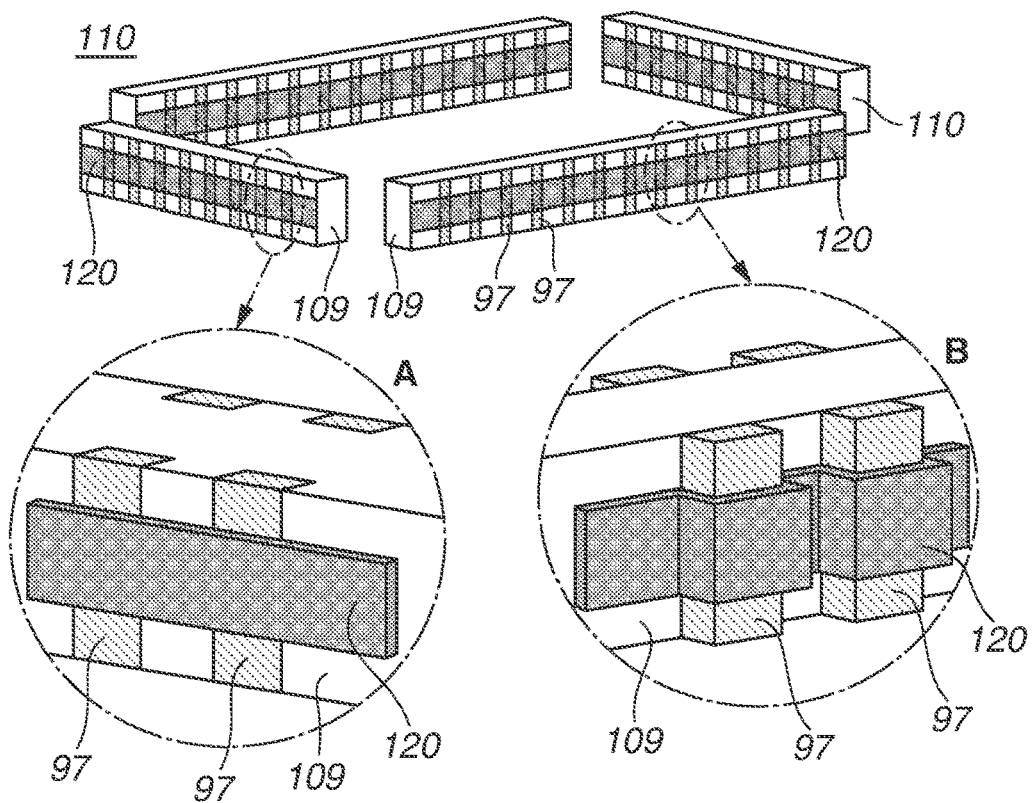
FIG. 9A is a diagram illustrating a modified example of the connection member according to the present exemplary embodiment.

FIG. 9A illustrates a modified example of the connection member 110 illustrated in FIG. 3C that can be applied to the third exemplary embodiment and the like. The connection member 110 includes a separation portion 120 disposed on each of the plurality of conductor portions 97. In this case, the separation portion 120 disposed continuously and covers the plurality of conductor portions 97. FIG. 9A illustrates an example "A" in which the conductor portions 97 are buried in respective concave portions formed in the insulator portion 109 and the side surfaces of the connection member 110 are planarized. FIG. 9A also illustrates an example "B" in which the plurality of conductor portions 97 is disposed on flat side surfaces of the insulator portion 109 and the side surfaces of the connection member 110 have irregularities. In the example "B", the concave portions are formed of the insulator portion 109 and convex portions are formed of the conductor portions 97. The separation portion 120 also includes irregularities along the concave and convex portions.

Figure 9B:
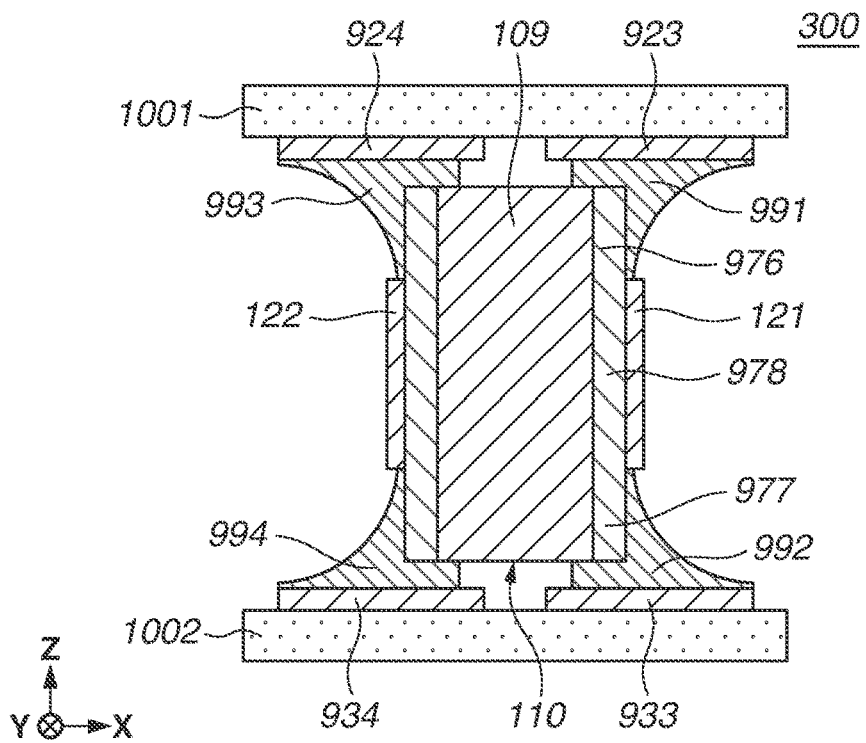
FIG. 9B is a diagram illustrating an example where the connection member is applied to the module according to the present exemplary.

FIG. 9B illustrates an example where the connection member 110 illustrated in FIG. 9A is applied to the module 300. The configuration illustrated in FIG. 9B differs from the configuration illustrated in FIG. 8B in that separation portions 121 and 122, which are examples of the separation portion 120, are disposed, and the other components may be similar to those in the configuration illustrated in FIG. 8B, and thus the descriptions thereof are omitted. The module 300 includes the separation portion 121 disposed between the conductive member 991 and the conductive member 992 in the Z-direction. The separation portion 121 facilitates the separation between the conductive member 991 and the conductive member 992. In the X-direction perpendicular to the Z-direction, the conductive portion 978 is disposed between the separation portion 121 and the insulator portion 109. The separation portion 121 covers the conductive portion 978, whereby the conductive members 991 and 992 is prevented from contacting the conductive portion 978. In the example illustrated in FIG. 9B, a thickness of the separation portion 121 in the X-direction is smaller than a thickness of the conductive portion 978 in the X-direction. This configuration prevents an increase in the size of the connection member 110. The configuration in which the conductive portion 978 is covered with the separation portion 121 makes it possible to reduce or prevent oxidation or the like of the conductive portion 978, and consequently reduce or prevent an increase or the like in resistance of the connection wire 973. In this case, the separation portion 121 can also be referred to as a protective portion for protecting the connection wire 973 (particularly, the conductive portion 978). The protection function can be enhanced by setting the thickness of the separation portion 121 in the X-direction to be larger than the thickness of the conductive portion 978 in the X-direction.

The separation portion 120 is disposed to prevent the plurality of conductor portions 97 from being short-circuited. Accordingly, the separation portion 120 is typically an insulator. As the insulator, an organic insulating film, such as a solder resist, an inorganic insulating film, such as oxide silicon, and the like can be used. In a case where the separation portion 120 is formed only on the conductor portions 97, a conductor may be used as the separation portion 120. In this case, the separation portion 121 can also be referred to as a conductive portion for improving conductivity of the connection wire 973. In the configuration illustrated in FIG. 9B, in a case where wettability of the conductive member 99 with respect to the separation portion 121 of the conductor and the wettability of the conductive member 99 with respect to the conductive portions 976 and 977 are low, the conductive member 991 and the conductive member 992 can be favorably separated from each other. In a case where a conductor is used as the separation portion 121, resistance of the connection wire 973 can also be decreased. In a case where the thickness of the separation portion 121 in the X-direction is larger than the thickness of the conductive portion 978 in the X-direction, resistance of the connection wire 973 can be easily reduced. The same holds true for the separation portion 122.

The configuration in which the wiring board 1001 and the wiring board 1002 are connected via the connection member 110 has been described above with reference to FIGS. 8A and 8B and FIGS. 9A and 9B. In this connection configuration, the type and arrangement of integrated circuit components mounted on the wiring board 1001 and the wiring board 1002 can be changed in various ways regardless of the relationship among the integrated circuit components 200, 50, and 51.

Figure 10A:
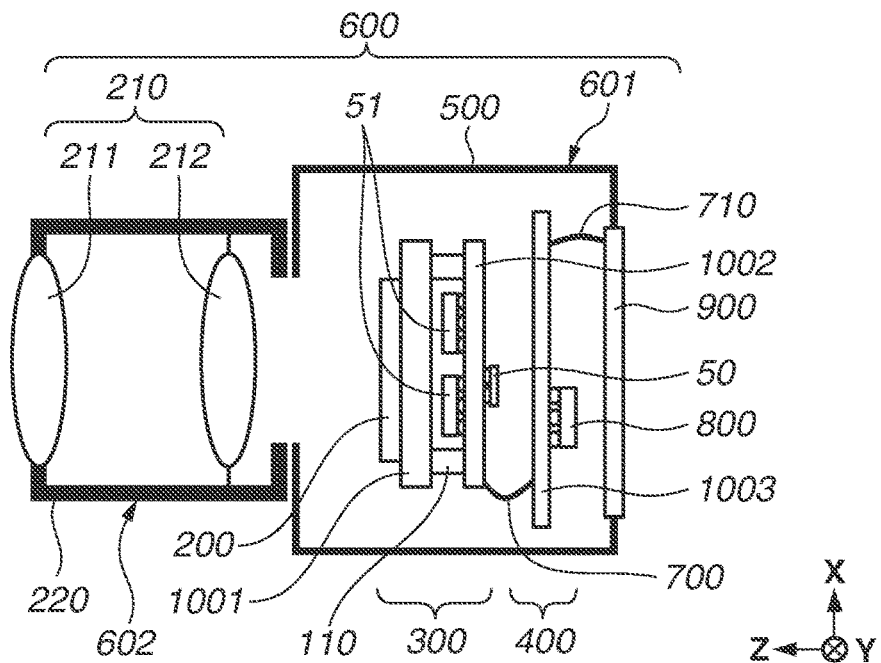
FIGS. 10A and 10B are schematic diagrams illustrating equipment.

FIG. 10A is a schematic diagram illustrating equipment 600 including the module 300 as an example of equipment according to the exemplary embodiments. The equipment 600 is, for example, a digital camera, a digital video camera, or a smartphone incorporating a camera, and includes the module 300 in which electronic components, such as the integrated circuit components 200, 50, and 51, are mounted on a printed wiring board. To achieve downsizing, high image quality, and high performance of the module 300 for image capturing in which the integrated circuit component 200 serves as an image capturing device, achieving higher-density packaging in which a larger number of electronic components are disposed on a wiring board with a limited size is required. Examples of the electronic components include the integrated circuit component 51 having a relatively large size, such as a memory, the integrated circuit component 50 for operating the integrated circuit components 200 and 51, and the passive component 52, such as a resistor or a capacitor. As for the integrated circuit component 200, a size of the integrated circuit component 200 can be increased along with advancement in high-definition technology to serve as an image capturing device for, for example, an APSC size or a full size. Along with this trend, the quantity of heat generated in the integrated circuit component 200 tends to increase. In addition, since the module 300 is used for continuous photographing or long-time moving image capturing, the integrated circuit component 200 is more likely to generate heat. In a case where a temperature of the integrated circuit component 50 for operating the integrated circuit component 200 is increased, Johnson noise is generated, which may lead to deterioration in image quality. In a case where the integrated circuit component 50 and the integrated circuit component 200 are mounted on the same wiring board, the heat resistance of the wiring board is constant and thus heat transfer from the integrated circuit component 200 to the integrated circuit component 50 is more likely to occur. To reduce effects of heat while the quantity of generated heat tends to increase, it is desirable to increase an arrangement distance between the integrated circuit components. Consequently, the area of the wiring board is increased, which makes it difficult to arrange the module 300 in a limited space within a downsized product. Therefore, a structure for achieving a high image quality while effects of heat from the integrated circuit component 200 on the integrated circuit component 50 is reduced without changing the size of the module 300 is required.

FIG. 10A is a schematic diagram illustrating the equipment 600 including the module 300 as an example of the equipment according to the present exemplary embodiment. The equipment 600 may have a configuration in which lenses and a camera body are integrated together. In the present exemplary embodiment, the equipment 600 is an interchangeable-lens digital single-lens camera and includes a camera body 601 and a lens barrel 602. The camera body 601 includes a casing 500, the module 300 disposed in the casing 500, and a circuit board 400. The lens barrel 602 includes an optical system 210 that forms an optical image on a light incident surface 301 of the image capturing device when the lens barrel 602 is attached to the camera body 601. The optical system 210 includes a lens 211 that is disposed on the light incidence side, and a lens 212 that is disposed on the light emission side. The lenses 211 and 212 are held in a casing 220 of the lens barrel 602. The module 300 and the circuit board 400 are electrically connected with a connection component 700. The module 300 (image capturing module) includes the wiring board 1001 on which the integrated circuit component 200 and the passive component 52, such as a resistor or a capacitor, are mounted, the wiring board 1002 on which a component with a certain height, such as a memory, and the integrated circuit component 50 are mounted, and the connection member 110. The wiring board 1001 and the wiring board 1002 are electrically connected via the connection member 110. The circuit board 400 includes an integrated circuit component 800, which is an example of the electronic components, and a wiring board 1003 on which the integrated circuit component 800 is mounted. The integrated circuit component 800 may be a processing device (processor) that processes a signal output from the integrated circuit component 800. The connection component 700 having flexibility is desirable. A cable, a flexible wiring board, or the like can be used as the connection component 700. A signal path between the integrated circuit component 200 and the integrated circuit component 800 leads to, for example, the integrated circuit component 800 from the integrated circuit component 200 via the wiring board 1001, the connection member 110, the wiring board 1002, and the connection component 700. In this case, a passive component (connector) for connecting the connection component 700 can be mounted on the wiring board 1002. However, the signal path between the integrated circuit component 200 and the integrated circuit component 800 may not pass through the connection member 110. The signal path between the integrated circuit component 200 and the integrated circuit component 800 may lead to the integrated circuit component 800 from the integrated circuit component 200 via the connection component 700, where the passive component (connector) for connecting the connection component 700 is mounted on the wiring board 1001. In this case, the signal path can be shortened, whereby a delay or the like can be reduced or prevented. The equipment 600 includes a module 900 (display module) including a display device, such as a liquid crystal display. The module 900 is connected to the wiring board 1003 via a connection component 710, such as a flexible wiring board.

The integrated circuit component 200 is, for example, a CMOS or CCD sensor. The integrated circuit component 200 includes a function for converting light incident through the lens barrel 602 into an electrical signal.

Figure 10B:
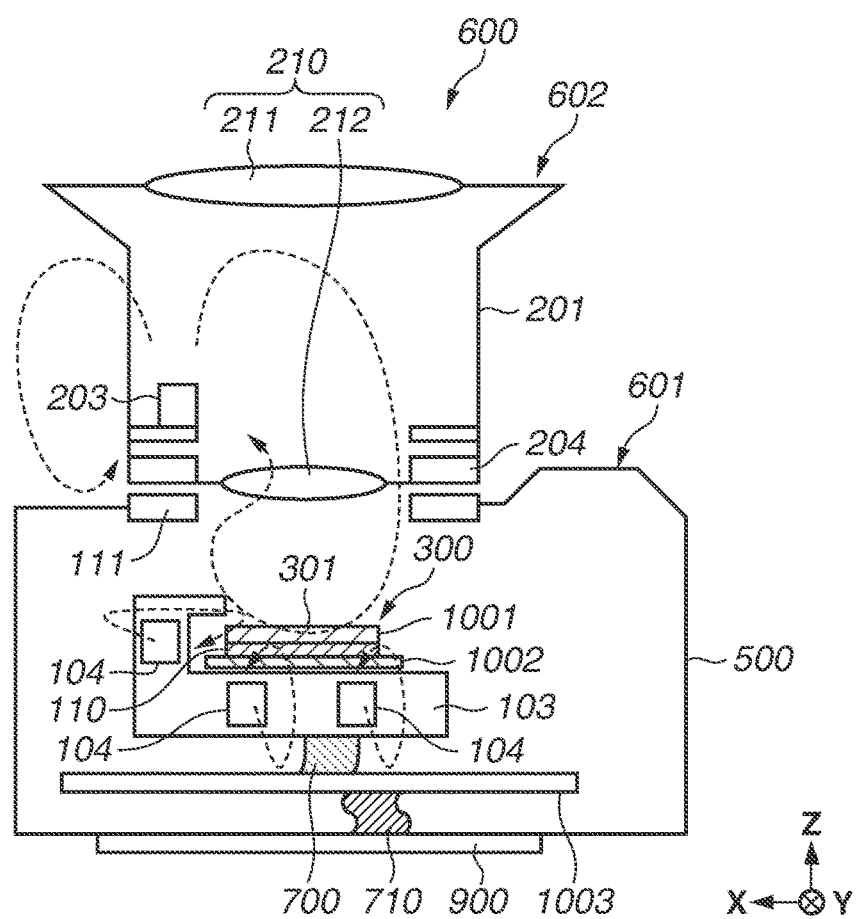

FIG. 10B is a schematic diagram of the equipment 600 including the module 300 according to the present exemplary embodiment. The equipment 600 may be a camera, such as a digital still camera, a digital video camera, a monitoring camera, a network camera, or a web camera. The equipment 600 may have a configuration in which the lenses and the camera body are integrated together, but is a digital single-lens camera. The equipment 600 includes the camera body 601 and the lens barrel 602 that is detachably mounted on the camera body 601. The camera body 601 includes the casing 500. The casing 500 includes a mount 111 on which the lens barrel 602 is detachably mounted. In the casing 500, the module 300 including the light incident surface 301 is disposed. A direction perpendicular to the light incident surface 301 is referred to as the Z-direction. The module 300 is held by a metal frame 103. The module 300 includes the wiring board 1001 on which the image capturing device is mounted, the wiring board 1002 that overlaps with the wiring board 1001, and the connection member 110 that connects the wiring board 1001 and the wiring board 1002. In the metal frame 103, a plurality of coils 104, which are examples of an inductor element, is disposed to mechanically drive the module 300. Each of the coils 104 generates a Lorentz force and drives the module 300 in a direction opposite to a direction of camera shake. The image capturing device is, for example, a CMOS image sensor or a CCD image sensor, and the image capturing device has a quadrangular outer shape, specifically, a rectangular shape, as viewed along the Z-direction perpendicular to the light incident surface 301. The long-side direction of the image capturing device that is parallel to the light incident surface 301 is referred to as the X-direction, and the short-side direction of the image capturing device is referred to as the Y-direction. For example, in the present exemplary embodiment, the Y-direction is a first direction and the Z-direction is a second direction. The image capturing device photoelectrically converts an optical image formed on the light incident surface 301, and outputs a pixel signal to the wiring board 1001. The lens barrel 602 includes the optical system 210 that forms an optical image on the light incident surface 301 of the image capturing device in a state where the lens barrel 602 is attached to the camera body 601. The lens barrel 602 includes a coil 203, which is an example of the inductor element, to mechanically drive the optical system 210. The optical system 210 includes the lens 211 disposed on the light incidence side and the lens 212 disposed on the light emission side. The lens barrel 602 is provided with a ring mount 204. The lens 212 is supported by the ring mount 204. The coil 203 is disposed at a position where an optical path leading to the light incident surface 301 of the image capturing device from the optical system 210 is not shielded, i.e., at a position on the outer periphery of the image capturing device in a front view as illustrated in FIG. 10B.

The coils 104 and 203 operate when an alternating current with a frequency band of kHz, i.e., frequencies of 1 [kHz] or more and less than 1 [MHz], is supplied. When an alternating current is supplied, a magnetic flux is generated around the coils 104 and 203. This magnetic flux causes inductive noise in the module 300. While orientation of the magnetic flux is indicated by a dashed-line arrow in FIG. 10B, the magnetic flux is an alternating magnetic field generated by an alternating current. Thus, the magnetic flux is alternately switched between the direction indicated by the dashed-line arrow and the direction opposite to the dashed-line arrow direction.

The magnetic field generated from the inductor element, such as the coils 104 and 203 illustrated in FIG. 10B, reaches the module 300. The closed loop control system in the module 300 has a resistance to inductive noise that varies in accordance with the type of a connected circuit. Specifically, in the module 300, a closed loop control system in the analog circuit has a lower resistance to inductive noise than a closed loop control system in the digital circuit. In particular, wires for a pixel array have a direct influence on pixel signals, and thus resistance to magnetic field noise is low. An induced current is more likely to flow through a wire with a lower impedance, and the resistance to magnetic field noise is low. In a case where a voltage distribution is generated in a closed loop control system of an analog ground due to induced electromotive power, pixel signals that are analog signals vary in accordance with the distribution of the ground potential. To prevent pattern noise from being generated in an output image from the image capturing device, i.e., to increase resistance to magnetic field noise in the module 300, reducing the area of the closed loop control system in the analog circuit is desirable.

The equipment 600 including the module 300 according to the present exemplary embodiment is not limited to the image capturing equipment, such as a camera, but instead may be electronic equipment, such as a smartphone or a personal computer, or display equipment, such as a television or a display. The equipment may also be transportation equipment, such as a vehicle, a ship, or a flight vehicle. More alternatively, the equipment may be medical equipment, such as an endoscope and radio diagnosis equipment, measurement equipment, such as a measurement sensor, analysis equipment, such as an electron microscope, business equipment, such as a printer, a scanner, and a copying machine, or industrial equipment, such as a robot and a manufacturing apparatus. In a case where various types of equipment as described above include a coil around which a magnetic field is generated, generation of dielectric noise can be reduced or prevented by employing the configuration of the module 300.

While the present exemplary embodiment described above illustrates an example where the module 300 according to the exemplary embodiment is applied to the image capturing module, the module 300 according to the exemplary embodiment may also be applied to a display module.

Example 1

In FIG. 2A, glass epoxy resin FR-4 is used for the wiring board 1001. The contour size of the wiring board 1001 is 43 mm×50 mm and the thickness of the wiring board 1001 is 0.5 mm. The conductor layers are each made of copper foil and include four layers. The first layer of the conductor layers is provided with a plurality of electrodes for connecting with the integrated circuit component 200. The electrodes include the power supply electrode 911 and the ground electrode 912 for supplying power for operating the integrated circuit component 200. The fourth layer of the conductor layers is provided with electrodes for connecting with the connection member 110. The diameter of each of the electrodes for connecting with the connection member 110 is 0.3 mm, and the electrodes adjacent to each other at the closest distance are formed with a pitch of 0.6 mm.

The size of the integrated circuit component 200 is about 30×40 mm, and the thickness of the integrated circuit component 200 is 0.7 mm. The integrated circuit component 200 is fixed to the wiring board 1001 by die bonding, and is connected to each of the electrodes on the wiring board with a bonding wire.

The size of the cover glass 201 is 40 mm×50 mm and the thickness of the cover glass 201 is 0.5 mm. The cover glass 201 is bonded to a resin frame with a height of 1 mm and a width of 1 mm to prevent the cover glass 201 from coming into contact with the integrated circuit component 200. The frame is bonded to the surface of the wiring board 1001.

Glass epoxy resin FR-4 is used for the wiring board 1002. The contour size of the wiring board 1002 is 43 mm×50 mm, and the thickness of the wiring board 1002 is 0.5 mm. The conductor layers are each made of copper foil and include four layers. The first layer of the conductor layers is provided with chip components, such as a memory, a capacitor, and a resistor, as integrated circuit components, and electrodes for connecting with the connection member 110. The diameter of each of the electrodes for connecting with the connection member 110 is 0.3 mm, and the electrodes adjacent to each other at the closest distance are formed with a pitch of 0.6 mm. The memory serving as the integrated circuit component 51 has a ball grid array (BGA) structure. The size of the memory is 14 mm×14 mm, and the thickness of the memory is 1.2 mm. Solder balls disposed on a lower surface of the memory are bonded to respective electrodes disposed on the wiring board 1002.

The fourth layer of the conductor layers is provided with a fourth electrode for connecting with the integrated circuit component 50. The size of the integrated circuit component 50 is 3 mm×3 mm, and the thickness of the integrated circuit component 50 is 0.7 mm. A lower surface of the integrated circuit component 50 is provided with a connection electrode, and the integrated circuit component 50 is bonded to the fourth electrode disposed on the wiring board 1002 via the conductive member 99.

As illustrated in FIG. 3A, the connection member 110 has a frame shape. The contour size of the connection member 110 is 34 mm×44 mm. The width of the frame is 1.6 mm, and the thickness of the frame is 2 mm. Glass epoxy resin FR-4 is used for the insulator. An upper surface and a lower surface of the connection member 110 are provided with a plurality of conductive portions. The conductive portions on the upper surface and the conductive portions on the lower surface facing each other are connected with the conductor portions 97 of the connection member 110. A through-hole is formed to electrically connect the upper surface and the lower surface by Cu plating. At upper and lower edges of the through-hole, copper plating is applied to bury the hole to form a lid. This lid serves as each of the electrodes. The diameter of each of the electrodes is 0.3 mm and the electrodes adjacent to each other at the closest distance are formed with a pitch of 0.6 mm.

The electrodes formed on the upper surface of the connection member 110 are bonded to the wiring board 1001 with the conductive members 99. The electrodes formed on the lower surface of the connection member 110 are bonded to the wiring board 1002 with the conductive members 99.

Using the module 300 having the above-described configuration makes it possible to reduce or prevent transmission of heat generated in the integrated circuit component 200 to the integrated circuit component 50, which reduces or suppresses generation of Johnson noise in the integrated circuit component 50, whereby deterioration in image quality can be prevented.

Example 2

In the configuration illustrated in FIG. 2A, glass epoxy resin FR-4 is used for the wiring board 1001. The contour size of the wiring board 1001 is 43 mm×50 mm and the thickness of the wiring board 1001 is 0.5 mm. The conductor layers are each made of copper foil and include four layers. The first layer of the conductor layers is provided with a plurality of electrodes for connecting with the integrated circuit component 200. The electrodes include the power supply electrode 911 and the ground electrode 912 for supplying power for operating the integrated circuit component 200. The fourth layer of the conductor layers is provided with electrodes for connecting with the connection member 110. The diameter of each of the electrodes for connecting with the connection member 110 is 0.3 mm, and the electrodes adjacent to each other at the closest distance are formed with a pitch of 0.6 mm.

The size of the integrated circuit component 200 is about 30×40 mm, and the thickness of the integrated circuit component 200 is 0.7 mm. The integrated circuit component 200 is fixed to the wiring board 1001 by die bonding, and is connected to each electrode on the wiring board 1001 with a bonding wire.

The size of the cover glass 201 is 40 mm×50 mm and the thickness of the cover glass 201 is 0.5 mm. The cover glass 201 is bonded to a resin frame with a height of 1 mm and a width of 1 mm to prevent the cover glass 201 from coming into contact with the integrated circuit component 200. The frame is bonded to the surface of the wiring board 1001.

Glass epoxy resin FR-4 is used for the wiring board 1002. The contour size of the wiring board 1002 is 43 mm×50 mm, and the thickness of the wiring board 1002 is 0.5 mm. The conductor layers are each made of copper foil and include four layers. The first layer of the conductor layers is provided with chip components, such as a memory, a capacitor, and a resistor, as integrated circuit components, and electrodes for connecting the connection member 110. The diameter of each of the electrodes for connecting with the connection member 110 is 0.3 mm, and the electrodes adjacent to each other at the closest distance are formed with a pitch of 0.6 mm. The memory as one of the integrated circuit components has a BGA structure. The size of the memory is 14 mm×14 mm, and the thickness of the memory is 1.2 mm. Solder balls disposed on a lower surface of the memory are bonded to respective electrodes disposed on the wiring board 1002.

The fourth layer of the conductor layers is provided with electrodes for connecting with the integrated circuit component 50. The size of the integrated circuit component 50 is 3 mm×3 mm, and the thickness of the integrated circuit component 50 is 0.7 mm. A lower surface of the integrated circuit component 50 is provided with connection electrodes, and the connection electrodes are bonded to respective electrodes disposed on the wiring board 1002 via the conductive members 99.

As illustrated in FIG. 3B, the connection member 110 has a rectangular parallelepiped shape. Two members having a certain size and two other members having another size are used for the connection member 110. Specifically, two members each having a width of 1.6 mm, a length of 40 mm, and a height of 2 mm and another two members each having a width of 1.6 mm, a length of 30 mm, and a height of 2 mm are used. As a material for the connection member 110, glass epoxy resin FR-4 is used as the insulator. An upper surface and a lower surface of the connection member 110 are provided with a plurality of conductive portions. The conductive portions on the upper surface and the conductive portions on the lower surface facing each other are connected with the conductor portions 97 of the connection member 110. Copper wires of Φ0.3 mm are used as conductors, and the conductors adjacent to each other at the closest distance are formed with a pitch of 0.6 mm.

As illustrated in FIG. 3B, the wiring board 1001 and the wiring board 1002 are electrically connected with four connection members 110 each having a rectangular parallelepiped shape.

Members other than the connection member 110 are the same as those in Example 1.

In a case where the connection member 110 having a frame shape as illustrated in FIG. 3A has a size of 20 mm×20 mm or larger, warping of about 0.15 mm can occur during heating. Accordingly, a bonding failure is more likely to occur during bonding with the wiring boards 1001 and 1002. On the other hand, the connection member 110 illustrated in FIG. 3B is separated into pieces, and the thermal deformation of each of the connection members 110 can be reduced to about 50%. Thus, a failure is less likely to occur during bonding between the wiring boards 1001 and 1002 and the connection member 110.

Using the module 300 having the above-described configuration makes it possible to reduce or prevent transmission of heat generated in the integrated circuit component 200 to the integrated circuit component 50, which reduces or suppresses generation of Johnson noise in the integrated circuit component 50, whereby deterioration in image quality can be prevented.

Example 3

In the configuration illustrated in FIG. 2C, glass epoxy resin FR-4 is used for the wiring board 1001. The contour size of the wiring board 1001 is 43 mm×50 mm, and the thickness of the wiring board 1001 is 0.5 mm. The conductor layers are each made of copper foil and include four layers. The first layer of the conductor layers is provided with a plurality of electrodes for connecting with the integrated circuit component 200. The electrodes include the power supply electrode 911 and the ground electrode 912 for supplying power for operating the integrated circuit component 200. The fourth layer of the conductor layers is provided with electrodes for connecting with the connection member 110. Each electrode has a width of 0.16 mm and a length of 0.4 mm. The electrodes are arranged in such a way that the center-of-gravity position of each of the electrodes on the wiring board 1001 is aligned with the center-of-gravity position of the corresponding conductive portion on the connection member 110.

The size of the integrated circuit component 200 is about 30×40 mm and the thickness of the integrated circuit component 200 is 0.7 mm. The integrated circuit component 200 is fixed to the wiring board 1001 by die bonding, and is connected to a corresponding one of the electrodes on the wiring board 1001 with a bonding wire.

The size of the cover glass 201 is 40 mm×50 mm and the thickness of the cover glass 201 is 0.5 mm. The cover glass 201 is bonded to a resin frame with a height of 1 mm and a width of 1 mm to prevent the cover glass 201 from coming into contact with the integrated circuit component 200. The frame is bonded to the surface of the wiring board 1001.

Glass epoxy resin FR-4 is used for the wiring board 1002. The contour size of the wiring board 1002 is 43 mm×50 mm, and the thickness of the wiring board 1002 is 0.5 mm. The conductor layers are each made of copper foil and include four layers. The first layer of the conductor layers is provided with chip components, such as a memory, a capacitor, and a resistor, as integrated circuit components, and electrodes for connecting with the connection member 110. Each of the electrodes for connecting with the connection member 110 has a width of 0.16 mm and a length of 0.4 mm. The electrodes are arranged in such a way that the center-of-gravity position of each of the electrodes on the wiring board 1002 is aligned with the center-of-gravity position of the corresponding conductive portion on the connection member 110.

The memory as one of the integrated circuit components has a BGA structure. The size of the memory is 14 mm×14 mm, and the thickness of the memory is 1.2 mm. Solder balls disposed on a lower surface of the memory are bonded to the respective electrodes disposed on the wiring board 1002.

The fourth layer of the conductor layers is provided with electrodes for connecting with the integrated circuit component 50. The size of the integrated circuit component 50 is 3 mm×3 mm, and the thickness of the integrated circuit component 50 is 0.7 mm. A lower surface of the integrated circuit component 50 is provided with connection electrodes bonded to the respective electrodes disposed on the wiring board 1002 via the conductive members 99.

As illustrated in FIG. 3C, the connection member 110 has a rectangular parallelepiped shape. Two members having a certain size and two other members having another size are used for the connection member 110. Specifically, two members each having a width of 1.6 mm, a length of 40 mm, and a height of 2 mm and another two members each having a width of 1.6 mm, a length of 30 mm, and a height of 2 mm are used.

As a material for the connection member 110, glass epoxy resin FR-4 is used as the insulator. Each of the conductive portions has a rectangular shape, and the conductive portions on the upper surface and the conductive portions on the lower surface are electrically connected with the conductor portions 97 of the connection member 110.

Conductors are each formed with an arbitrary size by etching copper foil with a thickness of 0.05 mm. The width of each of the conductive portions disposed on the upper and lower surfaces is 0.05 mm, which corresponds to the thickness of the copper foil, and the length of each of the conductive portions is 0.4 mm. A pitch between the conductive portions adjacent to each other is 0.6 mm.

The electrodes on the connection member 110 and the electrodes on the wiring boards 1001 and 1002 are connected with the conductive members 99.

The electrodes on the connection member 110 illustrated in FIGS. 3A and 3B are bonded only within the upper and lower surfaces. However, in the structure illustrated in FIG. 3C, not only the upper and lower surfaces, but also the conductive members 99 can be connected to the conductor portions 97 of the connection member 110. As illustrated in FIG. 2C, the fillets of the conductive members 99 are formed on the conductor portions 97 of the connection member 110 and on the electrodes of the wiring boards 1001 and 1002. Accordingly, the bonded portions of the connection member 110 illustrated in FIG. 3C can obtain higher reliability than the bonded portions of the connection member 110 illustrated in FIG. 2A.

Using the module 300 having the above-described configuration makes it possible to reduce or prevent transmission of heat generated in the integrated circuit component 200 to the integrated circuit component 50, which reduces or suppresses generation of Johnson noise in the integrated circuit component 50, whereby deterioration in image quality can be prevented.

Example 4

In the configuration illustrated in FIG. 5B, glass epoxy resin FR-4 is used for the wiring board 1001. The contour size of the wiring board 1001 is 43 mm×50 mm, and the thickness of the wiring board 1001 is 0.5 mm. The conductor layers are each made of copper foil and include four layers. The first layer of the conductor layers is provided with a plurality of electrodes for connecting with the integrated circuit component 200. The electrodes include the power supply electrode 911 and the ground electrode 912 for supplying power for operating the integrated circuit component 200. The fourth layer of the conductor layers is provided with electrodes for connecting with the connection member 110. The diameter of each of the electrodes for connecting the connection member 110 is 0.3 mm, and the electrodes adjacent to each other at the closest distance are formed with a pitch of 0.6 mm. Among the electrodes for connecting with the connection member 110, a pair of electrodes adjacent to each other at the closest distance corresponds to the power supply electrode 921 and the ground electrode 922. The power supply electrode 911 and the power supply electrode 921 are electrically connected with a wire and a via that are disposed on the wiring board 1001.

The size of the integrated circuit component 200 is about 30×40 mm, and the thickness of the integrated circuit component 200 is 0.7 mm. The integrated circuit component 200 is fixed to the wiring board 1001 by die bonding, and is connected to a corresponding one of the electrodes on the wiring board 1001 with a bonding wire.

The size of the cover glass 201 is 40 mm×50 mm, and the thickness of the cover glass 201 is 0.5 mm. The cover glass 201 is bonded to a resin frame with a height of 1 mm and a width of 1 mm to prevent the cover glass 201 from contacting the integrated circuit component 200. The frame is bonded to the surface of the wiring board 1001.

Glass epoxy resin FR-4 is used for the wiring board 1002. The contour size of the wiring board 1002 is 43 mm×50 mm, and the thickness of the wiring board 1002 is 0.5 mm. The conductor layers are each made of copper foil and include four layers. The first layer of the conductor layers is provided with chip components, such as a memory, a capacitor, and a resistor, as integrated circuit components, and electrodes for connecting with the connection member 110. The diameter of each of the electrodes for connecting the connection member 110 is 0.3 mm, and the electrodes adjacent to each other at the closest distance are formed with a pitch of 0.6 mm. The electrodes for connecting with the connection member 110 correspond to the power supply electrode 921 and the power supply electrode 931 on the wiring board 1001.

The memory as one of the integrated circuit components has a BGA structure. The size of the memory is 14 mm×14 mm, and the thickness of the memory is 1.2 mm. Solder balls disposed on a lower surface of the memory are bonded to the respective electrodes disposed on the wiring board 1002.

The fourth layer of the conductor layers is provided with electrodes for connecting with the integrated circuit component 50.

The size of the integrated circuit component 50 is 3 mm×3 mm, and the thickness of the integrated circuit component 50 is 0.7 mm. A lower surface of the integrated circuit component 50 is provided with a connection electrode that is bonded to the power supply electrode 941 disposed on the wiring board 1002 via the conductive member 99. The power supply electrode 931 and the power supply electrode 941 are electrically connected with a wire and a via that are disposed on the wiring board 1002.

As illustrated in FIG. 3A, the connection member 110 has a frame shape. The contour size of the connection member 110 is 34 mm×44 mm. The width of the frame is 1.6 mm, and the thickness of the frame is 2 mm. Glass epoxy resin FR-4 is used as the insulator. An upper surface and a lower surface of the connection member 110 are provided with a plurality of conductive portions. The conductive portions on the upper surface and the conductive portions on the lower surface facing each other are connected with the conductor portions 97 on the connection member 110. A through-hole is formed to electrically connect the upper surface and the lower surface by Cu plating. At upper and lower edges of the through-hole, copper plating is applied to bury the hole to forma lid. This lid serves as each of the electrodes. The diameter of each of the electrodes is 0.3 mm and the electrodes adjacent to each other at the closest distance are formed with a pitch of 0.6 mm.

The electrodes formed on the upper surface of the connection member 110 are bonded to the wiring board 1001 with the conductive members 99. The electrodes formed on the lower surface of the connection member 110 are bonded to the wiring board 1002 with the conductive members 99.

In the configuration illustrated in FIG. 5B, power for operating the integrated circuit component 200 is supplied from the integrated circuit component 50 that is bonded onto the wiring board 1002.

The power supply path leads to the power supply electrode 931 and the ground electrode 932 via the power supply wire 981 and the ground wire 982 on the wiring board 1002 from the pair of electrodes, i.e., power supply electrode 941 and ground electrode 942, for connecting with the integrated circuit component 50 in the wiring board 1002. Next, the path leads to the power supply electrode 921 and the ground electrode 922 via the conductor portions 97, i.e., power supply wire 971 and ground wire 972, for connecting with the upper surface and the lower surface of the connection member 110. Next, the path leads to the power supply electrode 911 and the ground electrode 912 via the power supply wire 961 and the ground wire 962 on the wiring board 1002 from the power supply electrode 921 and the ground electrode 922 in the wiring board 1001. Further, the path leads to the integrated circuit component 200 from the power supply electrode 911 and the ground electrode 912 via the conductive member 901 and the conductive member 902.

As illustrated in FIG. 5B and FIGS. 4A to 4C, the distance Da between the power supply electrode 921 and the ground electrode 922 is 0.6 mm, which corresponds to the pitch between the electrodes adjacent to each other at the closest distance, and the size of the integrated circuit component 200 in a plan view is 30 mm×40 mm. In this structure, in a case where the above-described expression (1) is satisfied, the area of the closed loop control system can be reduced, whereby the image quality can be improved.

Using the module 300 having the above-described configuration makes it possible to reduce or prevent transmission of heat generated in the integrated circuit component 200 to the integrated circuit component 50, which reduces or suppresses generation of Johnson noise in the integrated circuit component 50, whereby deterioration in image quality can be prevented.

Example 5

In Example 5, in the configuration illustrated in FIG. 5C, glass epoxy resin FR-4 is used for the wiring board 1001. The contour size of the wiring board 1001 is 43 mm×50 mm, and the thickness of the wiring board 1001 is 0.5 mm. The conductor layers are each made of copper foil and include four layers. The first layer of the conductor layers is provided with a plurality of electrodes for connecting with the integrated circuit component 200. The electrodes include the power supply electrode 911 and the ground electrode 912 for supplying power for operating the integrated circuit component 200. The fourth layer of the conductor layers is provided with electrodes for connecting with the connection member 110. The diameter of each of the electrodes for connecting with the connection member 110 is 0.3 mm, and the electrodes adjacent to each other at the closest distance are formed with a pitch of 0.6 mm. Among the electrodes for connecting with the connection member 110, a pair of electrodes adjacent to each other at the closest distance corresponds to the power supply electrode 921 and the ground electrode 922. The power supply electrode 911 and the ground electrode 912 are electrically connected to the power supply electrode 921 and the ground electrode 922, respectively, with the power supply wire 961 and the ground wire 962 that are disposed on the wiring board 1001.

The size of the integrated circuit component 200 is about 30×40 mm, and the thickness of the integrated circuit component 200 is 0.7 mm. The integrated circuit component 200 is fixed to the wiring board 1001 by die bonding, and is connected to each of the electrodes on the wiring board 1001 with a bonding wire.

The size of the cover glass 201 is 40 mm×50 mm, and the thickness of the cover glass 201 is 0.5 mm. The cover glass 201 is bonded to a resin frame with a height of 1 mm and a width of 1 mm to prevent the cover glass 201 from coming into contact with the integrated circuit component 200. The frame is bonded to the surface of the wiring board 1001.

Glass epoxy resin FR-4 is used for the wiring board 1002. The contour size of the wiring board 1002 is 43 mm×50 mm, and the thickness of the wiring board 1002 is 0.5 mm. The conductor layers are each made of copper foil and include four layers. The first layer of the conductor layers is provided with chip components, such as a memory, a capacitor, and a resistor, as integrated circuit components, and electrodes for connecting with the connection member 110. The diameter of each electrode for connecting with the connection member 110 is 0.3 mm, and the electrodes adjacent to each other at the closest distance are formed with a pitch of 0.6 mm. Among the electrodes for connecting with the connection member 110, a pair of electrodes facing the power supply electrode 921 and the power supply electrode 931 on the wiring board 1001 corresponds to the power supply electrode 931.

In the same plane, the power supply electrode 941 for connecting with the integrated circuit component 50 is disposed and is electrically connected to the power supply electrode 931 with a wire.

The size of the integrated circuit component 50 is 3 mm×3 mm, and the thickness of the integrated circuit component 50 is 0.7 mm. A lower surface of the integrated circuit component 50 is provided with a connection electrode that is bonded to the power supply electrode 941 via the conductive member 99.

The memory as one of the integrated circuit components has a BGA structure. The size of the memory is 14 mm×14 mm, and the thickness of the memory is 1.2 mm. Solder balls disposed on a lower surface of the memory are bonded to the respective electrodes disposed on the wiring board 1002.

As illustrated in FIG. 3A, the connection member 110 has a frame shape. The contour size of the connection member 110 is 34 mm×44 mm. The width of frame is 1.6 mm, and the thickness of the frame is 2 mm. Glass epoxy resin FR-4 is used as the insulator. An upper surface and a lower surface of the connection member 110 are provided with a plurality of conductive portions. The conductive portions on the upper surface and the conductive portions on the lower surface facing each other are connected with the conductor portions 97 of the connection member 110. A through-hole is formed to electrically connect the upper surface and the lower surface by Cu plating. At upper and lower edges of the through-hole, copper plating is applied to bury the hole to forma lid. This lid serves as each of the electrodes. The diameter of each of the electrodes is 0.3 mm and the electrodes adjacent to each other at the closest distance are formed with a pitch of 0.6 mm.

The electrodes formed on the upper surface of the connection member 110 are bonded to the wiring board 1001 with the conductive members 99. The electrodes formed on the lower surface of the connection member 110 are bonded to the wiring board 1002 with the conductive members 99.

In the configuration illustrated in FIG. 5C, power for operating the integrated circuit component 200 is supplied from the integrated circuit component 50 that is bonded onto the wiring board 1002.

The power supply path leads to the power supply electrode 931 via a wire of the wiring board from a pair of fourth power supply wires that connect the integrated circuit component 50 on the wiring board 1002. Next, the path leads to the power supply electrode 921 via the conductor portion 97 that connects the corresponding electrode on the upper surface and the lower surface of the connection member 110. Next, the path leads to the power supply electrode 911 via a wire of the wiring board and the first via conductor 96 from the power supply electrode 921 in the wiring board 1001, and then leads to the integrated circuit component 200 via a bonding wire.

As illustrated in FIG. 5C and FIGS. 4A and 4B, the distance Da between the power supply electrode 921 and the ground electrode 922 is 0.6 mm, which corresponds to the pitch between the electrodes adjacent to each other at the closest distance, and the size of the integrated circuit component 200 in a plan view is 30 mm×40 mm. In this structure, in a case where the above-described expression (1) is satisfied, the area of the closed loop control system can be reduced, whereby the image quality can be improved.

In this example, as described above, the integrated circuit component 50 mounted on the wiring board 1002 is disposed on the same plane as the connection member 110. Therefore, the area of the closed loop control system can be made smaller than the structure illustrated in FIG. 5B.

Using the module 300 having the above-described configuration makes it possible to reduce or prevent transmission of heat generated in the integrated circuit component 200 to the integrated circuit component 50, which reduces or suppresses generation of Johnson noise in the integrated circuit component 50, whereby deterioration in image quality can be prevented.

Example 6

In Example 6, the separation portion 120 having insulating properties is formed on the conductor portions 97 of the connection member 110 illustrated in FIG. 3C according to Example 3, and the connection member 110 illustrated in FIG. 9A is used. In this example, the separation portion 120 is a solder resist with a thickness of 15 µm, and has a width of 0.2 mm in the Z-direction. Solder is used for each conductive member 99. The separation portion 120 is disposed on a central portion on each side surface of the connection member 110. In the module 300 that uses the connection member 110, as illustrated in FIG. 9B, not only the upper and lower surfaces of the connection member 110, but also the conductive members 99 can be connected to the conductor portions 97 of the connection member 110. The conductive members 99 that are separated from the conductor portions 97 of the connection member 110 and the electrodes on the wiring board 1001 and the wiring board 1002 with the separation portion 120 are solder fillets with a favorable shape that smoothly curves in a concave shape. For example, since the conductive members 99 can be reliably separated by the separation portion 121 at the center in the vertical surface direction, the solder fillets, i.e., the conductive member 991 and the conductive member 992, on the upper surface and the lower surface can be uniformly formed. Further, for example, due to the separation portion 122, the upper and lower solder fillets, i.e., the conductive member 993 and the conductive member 994, are uniformly formed.

The length of each solder fillet can be independently controlled in the vertical direction by changing the position or width of the separation portion 120 of each conductive member in the vertical direction (Z-direction). Consequently, the connected portions having higher reliability than the connected portions of the connection member 110 illustrated in FIG. 2C can be obtained. Further, using the module 300 having the above-described configuration makes it possible to reduce ore prevent transmission of heat generated in the integrated circuit component 200 to the integrated circuit component 50, which reduces or suppresses generation of Johnson noise in the integrated circuit component 50, whereby deterioration in image quality can be prevented.

According to the present exemplary embodiment, it is possible to provide a technique that is advantageous in reducing and preventing generation of noise in a module.

The exemplary embodiments described above can be modified as appropriate without departing from the technical idea of the disclosure. The disclosed content of the present specification includes not only that described in the present specification, but all matters that are comprehensible from the present specification and the drawings attached to the present specification.

In the illustrated specific numerical ranges, "e" to "f" ("e" and "f" are numbers) indicate a range of "e" or more and/or "f" or less. In the illustrated specific numerical ranges, when a range from "i" to "j" and a range from "m" to "n" ("i", "j", "m", and "n" are numbers) are also written, a pair of a lower limit and an upper limit is not limited to a pair of "i" and "j" and a pair of "m" and "n". For example, a consideration may be made using a plurality of pairs of the lower limit and the upper limit in combination. Specifically, if the range from "i" to "j" and the range from "m" to "n" are also written, a consideration may be made in the range from "i" to "n", or a consideration may be made in the range from "m" to "j".

The disclosed content of the present specification also includes complementary sets of concepts described in the present specification. Specifically, if there is a description in the present specification to the effect that "A is larger than B", for example, it can be said that the present specification discloses to the effect that "A is not larger than B", even if a description to the effect that "A is not larger than B" is omitted. This is because it is a premise that a description to the effect that "A is larger than B" takes into consideration a case in which "A is not larger than B".

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2020-193346, filed Nov. 20, 2020, and Japanese Patent Application No. 2021-146900, filed Sep. 9, 2021, which are hereby incorporated by reference herein in their entirety.

What is claimed is:

1. A module comprising:
a first wiring board;
a first integrated circuit component mounted on the first wiring board;
a second wiring board overlapping with the first wiring board;
a second integrated circuit component mounted on the second wiring board; and
a connection member disposed between the first wiring board and the second wiring board and configured to electrically connect the first wiring board and the second wiring board,
wherein the second integrated circuit component overlaps with the first wiring board, and
wherein the second integrated circuit component supplies power to the first integrated circuit component via a wiring path of the connection member, the wiring path being disposed within a space between the first wiring board and the second wiring board.

2. The module according to claim 1, wherein the second integrated circuit component overlaps with the first integrated circuit component.

3. The module according to claim 1, wherein the connection member includes a first wire and a second wire, the first wire being configured to supply a power supply potential from the second integrated circuit component to the first integrated circuit component, the second wire being configured to supply a ground potential from the second integrated circuit component to the first integrated circuit component, and
wherein the first wire and the second wire are arranged within a space between the first wiring board and the second wiring board.

4. The module according to claim 3, wherein a distance between the first wire and the second wire is smaller than a size of the first integrated circuit component.

5. The module according to claim 4, wherein the distance is less than or equal to 1/10 of the size.

6. The module according to claim 3, wherein a distance between the first wire and the second wire is smaller than a distance between the first wiring board and the second wiring board.

7. The module according to claim 1, further comprising a third integrated circuit component mounted on the second wiring board,
wherein the third integrated circuit component is arranged between the first wiring board and the second wiring board, and
wherein a gap is interposed between the second integrated circuit component and the first wiring board.

8. The module according to claim 1, wherein the second integrated circuit component is disposed between the first wiring board and the second wiring board, and
wherein the first wiring board is disposed between the first integrated circuit component and the second wiring board.

9. The module according to claim 1, wherein the second wiring board is disposed between the second integrated circuit component and the first wiring board, and
wherein at least one of the first wiring board and the second wiring board is disposed between the first integrated circuit component and the second integrated circuit component.

10. The module according to claim 1, wherein when the power is supplied, a temperature of the first integrated circuit component is higher than a temperature of the second integrated circuit component.

11. The module according to claim 1, wherein the first integrated circuit component includes an analog circuit.

12. The module according to claim 1, wherein the first integrated circuit component is one of an image capturing device and a display device.

13. A module comprising:
a first wiring board;
a first integrated circuit component mounted on the first wiring board;
a second wiring board overlapping with the first wiring board;
a second integrated circuit component mounted on the second wiring board; and
a connection member disposed between the first wiring board and the second wiring board and configured to electrically connect the first wiring board and the second wiring board,
wherein the second integrated circuit component overlaps with the first wiring board,
wherein the second integrated circuit component supplies power to the first integrated circuit component via the connection member,
wherein the connection member and the first wiring board are connected with solder arranged between the first wiring board and the second wiring board, and
wherein the connection member and the second wiring board are connected with solder arranged between the first wiring board and the second wiring board.

14. The module according to claim 13, further comprising a third integrated circuit component mounted on the second wiring board.

15. The module according to claim 14, wherein the third integrated circuit component is a storage device.

16. The module according to claim 14, wherein the second integrated circuit component supplies power to the third integrated circuit component.

17. The module according to claim 13, wherein a passive component is mounted on the second wiring board, and
wherein the passive component is arranged between the first wiring board and the second wiring board.

18. The module according to claim 13, wherein the connection member includes a portion made of glass epoxy resin.

19. The module according to claim 1, wherein the connection member includes a portion made of thermosetting resin.

20. A module comprising:
a first wiring board;
a first integrated circuit component mounted on the first wiring board;
a second wiring board overlapping with the first wiring board;
a second integrated circuit component mounted on the second wiring board; and a connection member disposed between the first wiring board and the second wiring board and configured to electrically connect the first wiring board and the second wiring board, wherein the second integrated circuit component overlaps with the first wiring board and supplies power to the first integrated circuit component via the connection member, wherein the connection member includes a conductor portion and an insulator portion configured to support the conductor portion, wherein the conductor portion includes a first conductive portion, a second conductive portion, and a third conductive portion along a first direction in which the first wiring board and the second wiring board overlap with each other, the third conductive portion being disposed between the first conductive portion and the second conductive portion, wherein the first conductive portion is connected to the first wiring board via a first conductive member, and the second conductive portion is connected to the first second wiring board via a second conductive member, and wherein in a second direction perpendicular to the first direction, the first conductive portion is disposed between the first conductive member and the insulator portion, and the second conductive portion is disposed between the second conductive member and the insulator portion.

21. The module according to claim 20, further comprising:
a separation portion disposed between the first conductive member and the second conductive member in the first direction,
wherein in the second direction, the third conductive portion is disposed between the separation portion and the insulator portion.

22. The module according to claim 21, wherein each of the first conductive member and the second conductive member is a solder fillet and the separation portion is a solder resist.

23. Equipment comprising:
a module according to claim 1;
a third wiring board; and
a connection component configured to electrically connect the module and the third wiring board,
wherein the connection component has flexibility.

24. Equipment comprising:
a module according to claim 1; and
a coil.

25. Equipment comprising:
a module according to claim 1; and
at least one of:
a semiconductor device manufactured using a 1 to 4 nm process;
a communication apparatus configured to perform communication using terahertz waves; and
an all-solid-state battery.

26. The module according to claim 13,
wherein the first integrated circuit component and the first wiring board are connected with a bonding wire, and
wherein the second integrated circuit component and the second wiring board are connected with solder.

27. The module according to claim 13,
wherein at least one of the first wiring board and the second wiring board is disposed between the first integrated circuit component and the second integrated circuit component.

28. The module according to claim 1,
wherein the second integrated circuit component includes a linear regulator or a direct current (DC)-to-DC converter.

29. Equipment comprising:
a module according to claim 13;
a third wiring board; and
a connection component configured to electrically connect the module and the third wiring board,
wherein the connection component has flexibility.

30. Equipment comprising:
a module according to claim 20;
a third wiring board; and
a connection component configured to electrically connect the module and the third wiring board,
wherein the connection component has flexibility.

* * * * *